(12) United States Patent
Kawakubo et al.

(10) Patent No.: US 7,215,066 B2
(45) Date of Patent: May 8, 2007

(54) PIEZOELECTRIC ACTUATOR AND MICRO-ELECTROMECHANICAL DEVICE

(75) Inventors: Takashi Kawakubo, Yokohama (JP);
Toshihiko Nagano, Kawasaki (JP);
Kazuhide Abe, Kawasaki (JP);
Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 11/196,596

(22) Filed: Aug. 4, 2005

(65) Prior Publication Data

US 2006/0055287 A1    Mar. 16, 2006

(30) Foreign Application Priority Data

Sep. 16, 2004    (JP) .............................. 2004-269911

(51) Int. Cl.
*H01L 41/053*    (2006.01)
(52) U.S. Cl. ...................... 310/348; 310/366; 977/837
(58) Field of Classification Search ........... 310/323.01, 310/323.02, 323.16–323.18, 348, 366; 977/712, 977/724, 732, 837
See application file for complete search history.

(56) References Cited

U.S. PATENT DOCUMENTS

| | | | | |
|---|---|---|---|---|
| 5,606,452 | A | * | 2/1997 | Min ........................ 359/295 |
| 6,018,212 | A | * | 1/2000 | Kikuchi et al. ............. 310/321 |
| 7,157,831 | B2 | * | 1/2007 | Allaei .................... 310/323.02 |
| 2005/0099236 | A1 | | 5/2005 | Kawakubo et al. |
| 2006/0290236 | A1 | * | 12/2006 | Ikehashi ..................... 310/330 |

FOREIGN PATENT DOCUMENTS

| | | | | |
|---|---|---|---|---|
| JP | 58-200616 | * | 11/1983 | ................. 310/348 |
| JP | 2-129514 | * | 5/1990 | ................. 310/348 |
| JP | 6-117862 | * | 4/1994 | ................. 310/370 |
| JP | 2003-181800 | | 7/2003 | |

OTHER PUBLICATIONS

U.S. Appl. No. 11/054,404, filed Feb. 10, 2005, Takashi Kawakubo, et al.
U.S. Appl. No. 11/115,107, filed Apr. 27, 2005, Takashi Kawakubo, et al.
U.S. Appl. No. 11/196,596, filed Aug. 4, 2005, Kawakubo et al.
U.s. Appl. No. 11/229,694, filed Sep. 20, 2005, Kawakubo et al.

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

A piezoelectric actuator includes a first beam including a first bottom electrode, a first piezoelectric film on the first bottom electrode, and a first top electrode on the first piezoelectric film, a fixed end assigned at an end of the first beam and fixed on a substrate, a connecting end assigned at another end of the first beam and suspended over a free space; and a second beam including a second piezoelectric film connected to the first piezoelectric film at the connecting end, a second bottom electrode under the second piezoelectric film, and a second top electrode on the second piezoelectric film, a working end assigned at an end of the second beam opposite to another end to which the connecting end is assigned and suspended over the free space; wherein a distance between centers of the fixed end and the working end is shorter than a distance from the working end to the connecting end.

20 Claims, 35 Drawing Sheets

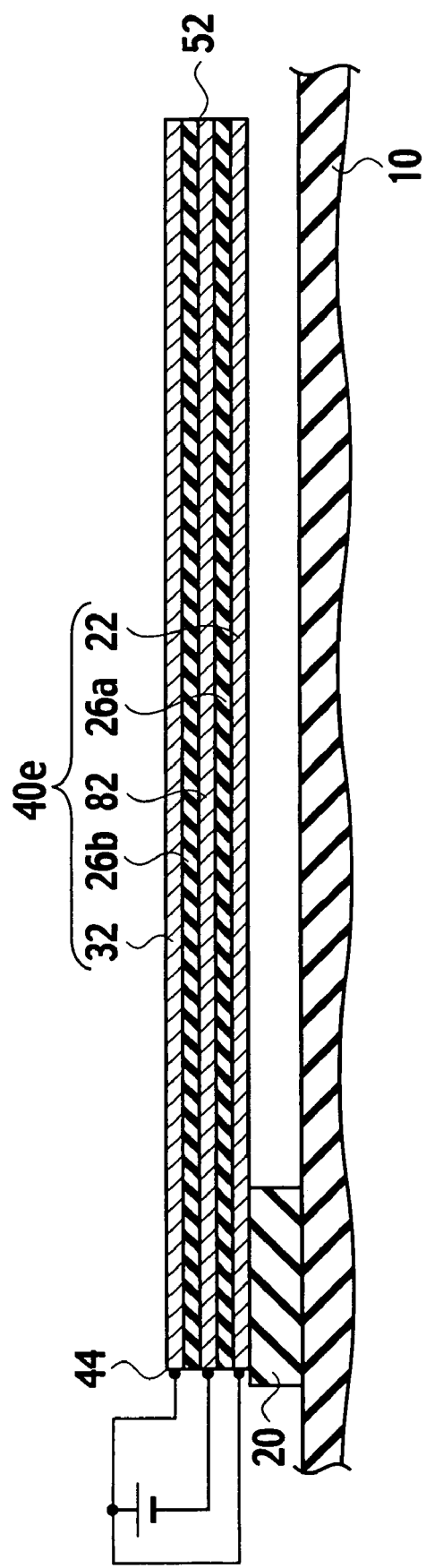

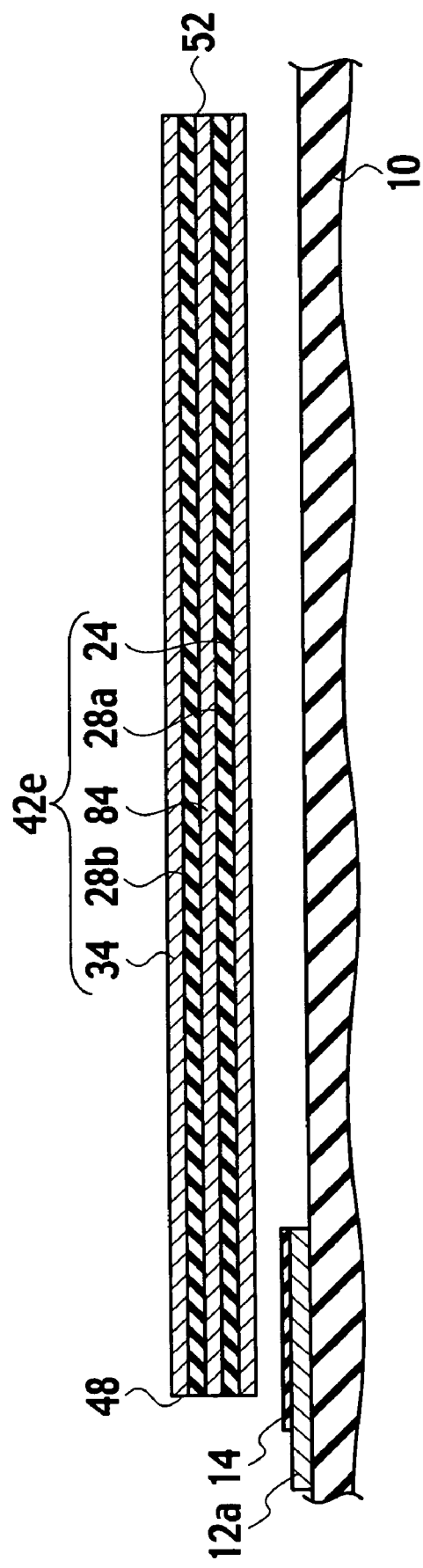

PIEZOELECTRIC ACTUATOR AND MICRO-ELECTROMECHANICAL DEVICE

CROSS REFERENCE TO RELATED APPLICATIONS AND INCORPORATION BY REFERENCE

This application is based upon and claims the benefit of priority from prior Japanese patent application P2004-269911 filed on Sep. 16, 2004; the entire contents of which are incorporated by reference herein.

BACKGROUND OF THE INVENTION

1. Field of the Invention

The present invention relates to an actuator using a piezoelectric thin film, and in particular, to a micro-electromechanical device using a piezoelectric actuator.

2. Description of the Related Art

Recently, an actuator fabricated by a micro-electromechanical system (MEMS) technology has attracted attention. In the actuator, a beam is bended and displaced by a drive force, such as an electrostatic force, a thermal stress, an electromagnetic force, and a piezoelectric force. In Japanese Patent Laid-Open Publication No. 2003-181800, a shaft attached on a free end of an actuator using a piezoelectric thin film is rotated.

Moreover, micro-electromechanical devices, such as a variable capacitor and a switch, which use an actuator, has been proposed. The variable capacitor or the switch fabricated by the MEMS technology includes a movable electrode provided on a beam of the actuator having a released end supported on a substrate, and a fixed electrode provided on a surface of the substrate, which faces the actuator. The actuator varies in distance between the movable electrode and the fixed electrode.

In particular, in a variable capacitor having a piezoelectric actuator which uses an inverse piezoelectric effect or an electrostrictive effect as a drive force, a movable beam may continuously and widely vary the interval between the movable electrode and the fixed electrode. Accordingly, a capacitance variation of the variable capacitor may increase. Moreover, since the air or gas between the movable electrode and the fixed electrode is used as a dielectric, the variable capacitor has advantages of an extremely large Q value and the like.

Moreover, the structure of a variable capacitor may have applicability to a switch. For example, in a capacitive type switch, a movable electrode is capacitively coupled with a fixed electrode across an extremely thin dielectric film. Alternatively, in a DC contact type switch, a movable electrode is brought into direct contact with a fixed electrode. Such a switch fabricated by the MEMS technology has also attracted attention, since the switch has both a low on-state resistance and a high insulating isolation property in an off-state.

A piezoelectric actuator has a long and thin beam including a piezoelectric film sandwiched by upper and bottom electrodes. The beam is projected in the air. Therefore, it is a serious problem that the beam is vertically warped due to a slight residual stress in a material of the piezoelectric film. Hence, it is extremely difficult to adjust a capacitance value with an applied voltage to a variable capacitor as designed, or to set a drive voltage of a switch at a steady value.

For example, at an operation end in which the movable electrode is provided in the piezoelectric actuator, a displacement D of the beam due to the inverse piezoelectric effect is approximated by the following expression:

$$D \sim E \cdot d_{31} \cdot L^2 \cdot t^{-1} \quad (1)$$

where E is an electric field applied to the piezoelectric film, $d_{31}$ is a piezoelectric strain coefficient of the piezoelectric film, and L and t are a length and thickness of the actuator respectively.

A warpage Dw of the piezoelectric actuator, which is caused by a residual stress occurring on the deposited piezoelectric film and the like, is approximated by the following expression:

$$Dw \sim Sr \cdot L^2 \cdot t^{-1} \quad (2)$$

where Sr is a residual stress.

As understood from a comparison between expression (1) and expression (2), both of the displacement D and the warpage Dw have a similar relation regarding the length L and the thickness t of the piezoelectric actuator. Specifically, the displacement D and the warpage Dw are proportional to a square of length L, and are inversely proportional to the thickness t. For example, in order to expand a drive range of the piezoelectric actuator, it is effective to increase the length L or to decrease the thickness t. In response, the displacement D may be increased, but also the warpage Dw is increased. Hence, in order to increase the drive range of the piezoelectric actuator with suppressing the warpage, geometrical modification for the actuator may have almost no effect. There will be no other way but to reduce an absolute value of the residual stress Sr compared to an absolute value of the piezoelectric strain ($E \cdot d_{31}$) due to the inverse piezoelectric effect.

Regarding lead zirconate titanate (PZT) that is a piezoelectric film having a large inverse piezoelectric effect, it is necessary to anneal a PZT film at about 600° C. after the PZT film is deposited at room temperature in order to obtain a good film quality. A contraction in volume may occur due to such annealing. Accordingly, a residual stress of the PZT piezoelectric film is inevitably increased. Meanwhile, for a piezoelectric film, such as aluminum nitride (AlN), zinc oxide (ZnO), and the like, which can be deposited at around the room temperature with a good film quality, it is possible to relatively precisely control a residual stress by adjusting deposition conditions. However, an inverse piezoelectric effect in the piezoelectric film, such as AlN, ZnO, and the like, is smaller than the PZT film by a factor of ten or more.

In the case of using a piezoelectric material having such a large inverse piezoelectric effect in order to increase the piezoelectric strain of the piezoelectric film of the piezoelectric actuator, it is difficult to control a residual stress in a piezoelectric film, and to suppress a warpage of the actuator. Moreover, a piezoelectric material, in which the residual stress can be controlled relatively easily, has a small inverse piezoelectric effect. In such piezoelectric material, a drive range of the actuator cannot be sufficiently increased in comparison with the warpage of the actuator. Due to the problems as described above, technological application of the piezoelectric actuator is precluded. The piezoelectric actuator is largely warped by the slight residual stress due to a serious problem relating to such a structure of the piezoelectric actuator, that is, the thin and long beam structure. Therefore, it is difficult to fabricate a variable capacitor with a capacitance held constant, or a switch with an operation voltage held constant.

SUMMARY OF THE INVENTION

It is an object of the present invention to provide a micro-electromechanical device having a piezoelectric actuator which is capable of controlling a displacement with high accuracy and reproducibility, by suppressing a warpage due to residual stress in a piezoelectric film.

A first aspect of the present invention provides a piezoelectric actuator including a first beam including a first bottom electrode, a first piezoelectric film on the first bottom electrode, and a first top electrode on the first piezoelectric film, a fixed end assigned at an end of the first beam and a connecting end assigned at another end of the first beam, the fixed end fixed on a substrate, the connecting end suspended over a free space; and a second beam including a second piezoelectric film connected to the first piezoelectric film at the connecting end, a second bottom electrode under the second piezoelectric film, and a second top electrode on the second piezoelectric film, a working end assigned at an end of the second beam opposite to another end to which the connecting end is assigned, the working end suspended over the free space; wherein a distance between centers of the fixed end and the working end is shorter than a distance from the working end to the connecting end.

A second aspect of the present invention provides a micro-electromechanical device including a first beam including a first bottom electrode, a first piezoelectric film on the first bottom electrode, and a first top electrode on the first piezoelectric film, a fixed end assigned at an end of the first beam and a connecting end assigned at another end of the first beam, the fixed end fixed on a substrate, the connecting end suspended over a free space; a second beam including a second piezoelectric film connected to the first piezoelectric film at the connecting end, a second bottom electrode under the second piezoelectric film, and a second top electrode on the second piezoelectric film, a working end assigned at an end of the second beam opposite to another end to which the connecting end is assigned, the working end suspended over the free space; and a fixed electrode disposed on a surface of the substrate facing the working end, wherein a distance between centers of the fixed end and the working end is shorter than a distance from the working end to the connecting end.

BRIEF DESCRIPTION OF THE DRAWINGS

FIG. 46 is a schematic view showing an example of a cross section along a line XLVI—XLVI of the piezoelectric actuator of FIG. 44.

FIG. 47 is a schematic view showing an example of a cross section along a line XLVII—XLVII of the piezoelectric actuator of FIG. 44.

DETAILED DESCRIPTION OF THE INVENTION

Figure 1:
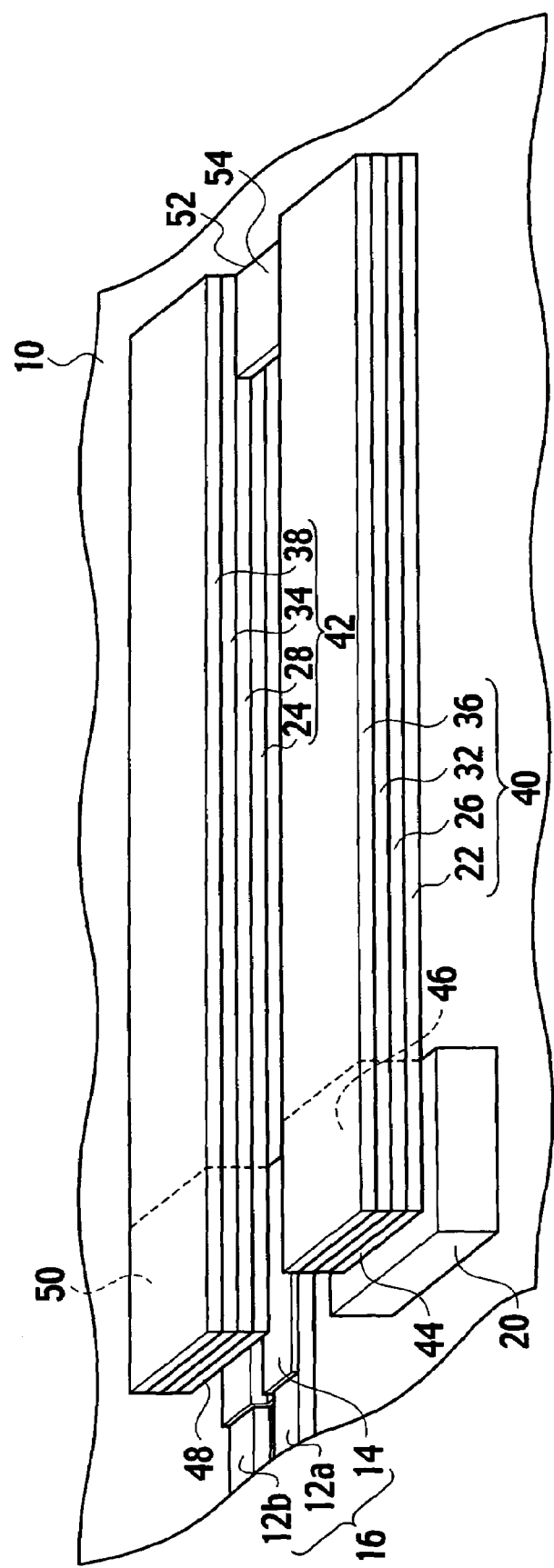
FIG. 1 is a perspective view showing an example of a piezoelectric actuator according to an embodiment of the present invention.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

A piezoelectric actuator according to an embodiment of the present invention is used in a micro-electromechanical device such as a variable capacitor. As shown in FIG. 1, the piezoelectric actuator includes a first beam 40 and a second beam 42. The first beam 40 is extended from a fixed end 44 of a fixed portion 46 fixed to an anchor 20 on a substrate 10 to a connecting end 52 of a connecting portion 54. The second beam 42 is extended from the connecting end 52 to a working end 48 of a working portion 50 in a direction to the fixed end 44 in parallel to the first beam 40. Moreover, a fixed electrode 16 including conductors 12a, 12b covered with a dielectric film 14 is provided on a surface of the substrate 10, so as to face the working portion 50. The fixed end 44 and the working end 48 are placed adjacent to each other.

Figure 2:
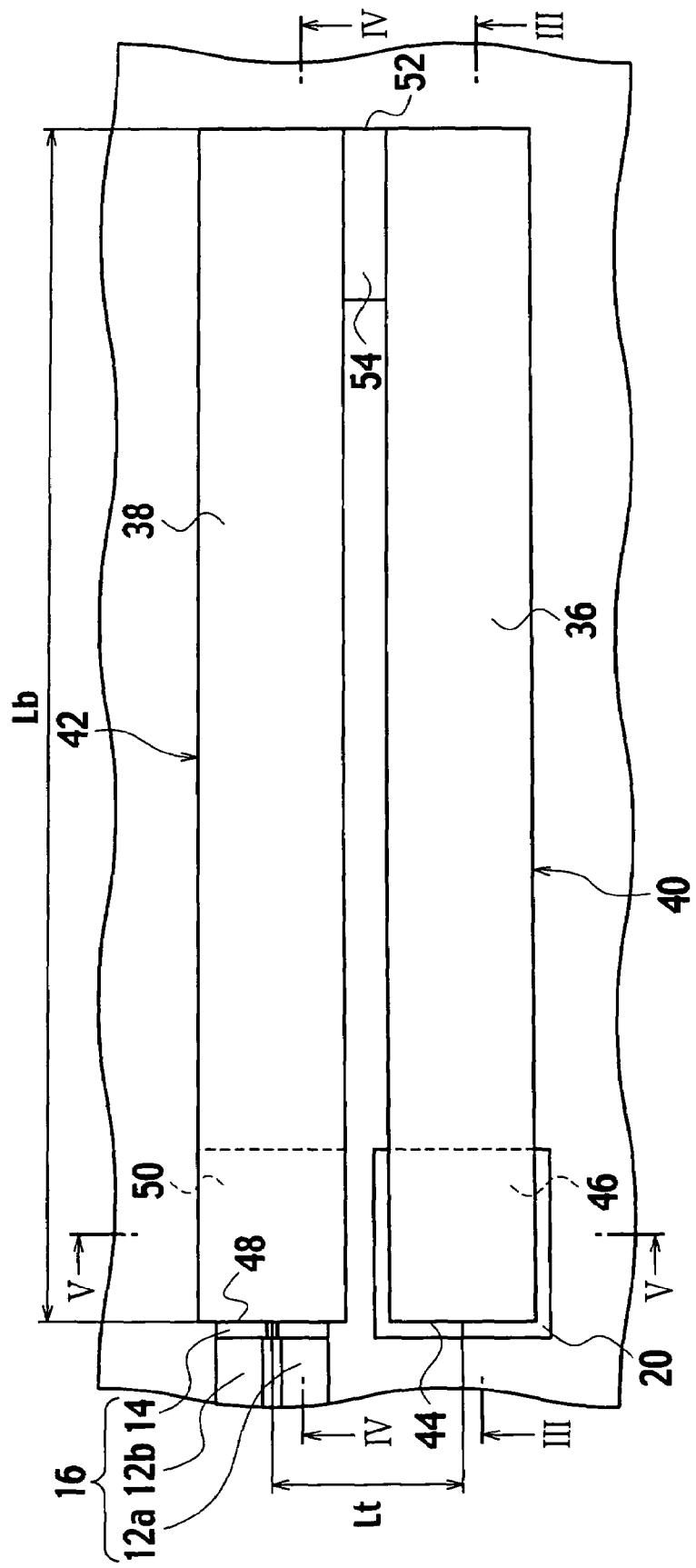
FIG. 2 is a schematic plan view showing an example of the piezoelectric actuator according to the embodiment of the present invention.

As shown in FIG. 2, a beam interval Lt between the first and second beams 40, 42 is a direct distance between centers of the fixed end 44 and the working end 48. Moreover, a beam length Lb is a direct distance from the working end 48 to the connecting end 52. The beam interval Lt is shorter than the beam length Lb.

Figure 3:
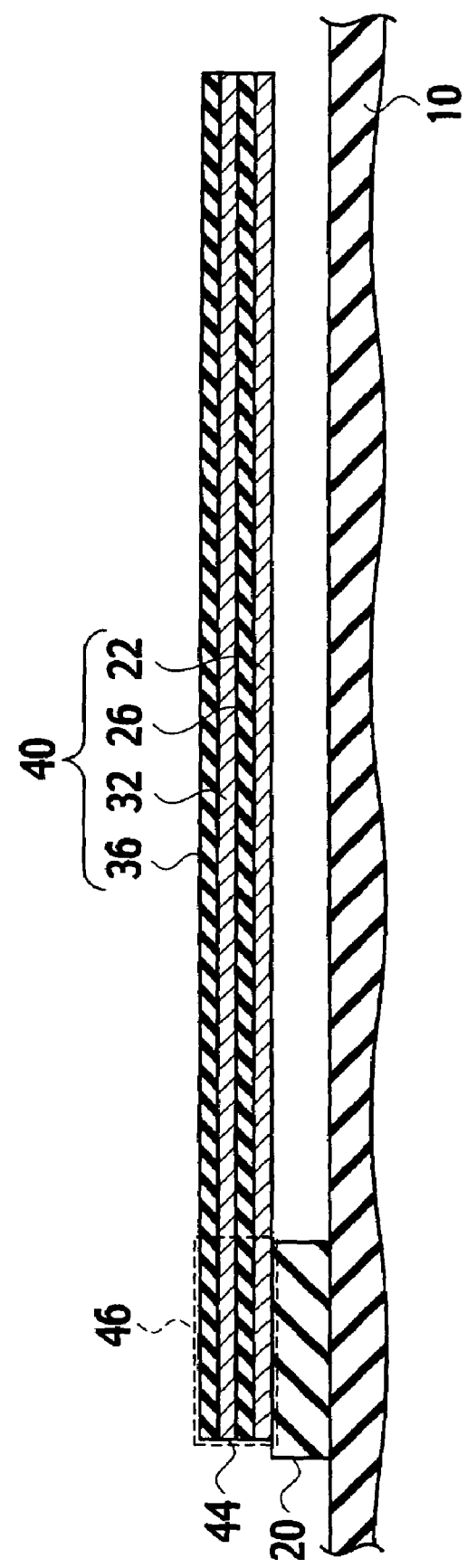
FIG. 3 is a schematic view showing an example of a cross section along a line III—III in the piezoelectric actuator of FIG. 2.

As shown in FIG. 3, the first beam 40 includes a first piezoelectric film 26, a first bottom electrode 22, a first top electrode 32, and a first supporting film 36. The first bottom electrode 22 is provided on a surface of the first piezoelectric film 26, which faces the substrate 10. The first top electrode 32 faces the first bottom electrode 22 to sandwich the first piezoelectric film 26 with the first bottom electrode 22. The first supporting film 36 is provided on the first top electrode 32

Figure 4:
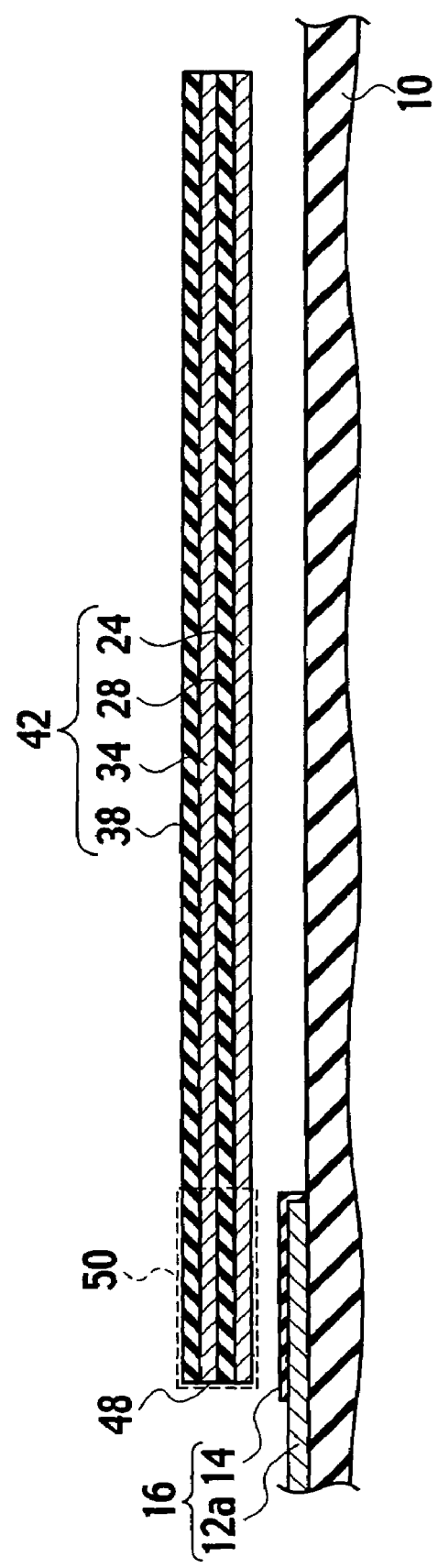
FIG. 4 is a schematic view showing an example of a cross section along a line IV—IV in the piezoelectric actuator of FIG. 2.

As shown in FIG. 4, the second beam 42 includes a second piezoelectric film 28, a second bottom electrode 24, a second top electrode 34, and a supporting film 38. The second bottom electrode 24 is provided on a surface of the second piezoelectric film 28, which faces the substrate 10. The second top electrode 34 faces the second bottom electrode 24 to sandwich the second piezoelectric film 28 with the second bottom electrode 24. The supporting film 38 is provided on the second top electrode 34.

Each of the first and second beams 40, 42 has an asymmetric bimorph structure or a unimorph structure. Note that the first piezoelectric film 26 of the first beam 40 is connected to the second piezoelectric film 28 of the second beam 42 through the connecting portion 54. The first and second piezoelectric films 26, 28 and the connecting portion 54 are a continuous piezoelectric layer having the same polarization direction.

For the substrate 10, an insulating glass substrate, a semiconductor substrate such as silicon (Si), and the like is used. For the anchor 20, an insulating film such as silicon oxide ($SiO_2$), is used. For each of the first and second supporting films 36, 38, and the dielectric film 14, an insulating film such as $SiO_2$, and silicon nitride ($Si_3N_4$), is used. Additionally, for the first and second bottom electrodes 22, 24, the first and second top electrodes 32, 34, the conductors 12a, 12b, and the like, a metal such as aluminum (Al), gold (Au), platinum (Pt), copper (Cu), iridium (Ir), tungsten (W), and molybdenum (Mo), which has a low resistance and can be easily processed, is desirably used. Furthermore, a wurtzite crystal, such as AlN, ZnO, is desirable as a piezoelectric material for the first and second piezoelectric films 26, 28 and the connecting portion 54 because the wurtzite crystal is stable. Furthermore, a perovskite ferroelectric material such as PZT and barium titanate (BTO), is also usable.

Figure 5:
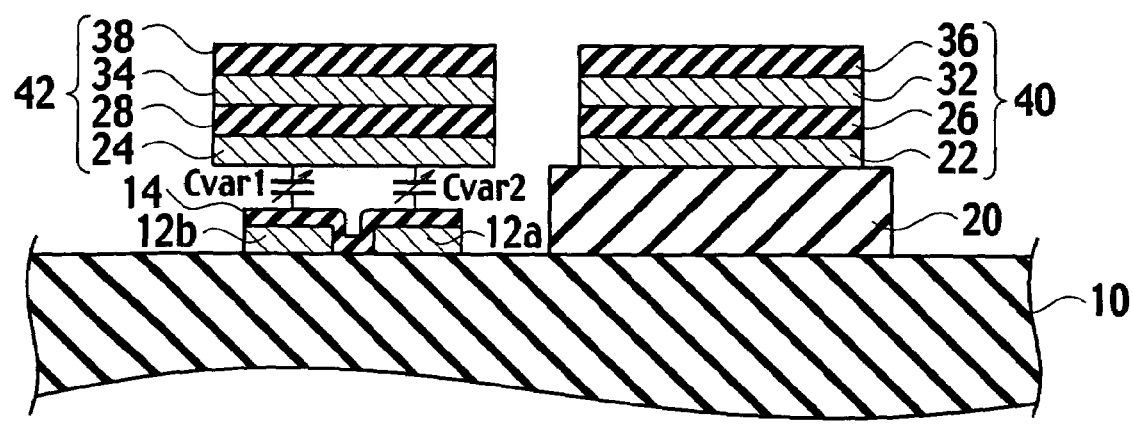
FIG. 5 is a schematic view showing an example of a cross section along a line V—V in the piezoelectric actuator of FIG. 2.
Figure 6:
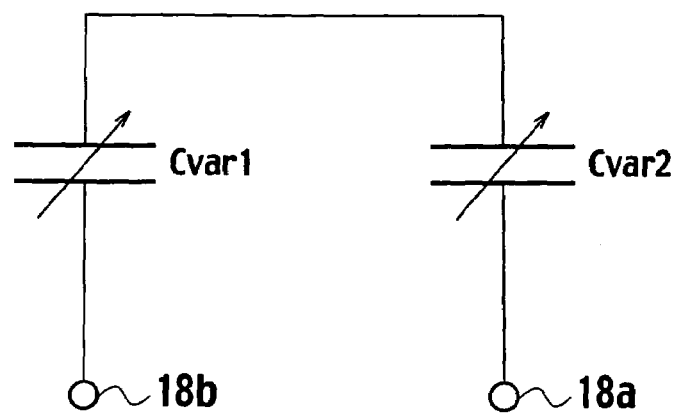
FIG. 6 is a view showing an example of an equivalent circuit of a variable capacitor using the piezoelectric actuator according to the embodiment of the present invention.

As shown in FIG. 5, the variable capacitor according to the embodiment of the present invention has capacitors $C_{var1}$ and $C_{var2}$ between the conductors 12a, 12b and the second bottom electrode 24. As shown in FIG.6, the capacitors $C_{var1}$ and $C_{var2}$ are connected in series between terminals 18a, 18b connected to the conductors 12a, 12b. The capacitors $C_{var1}$ and $C_{var2}$ change their capacitances in response to a change in a distance between the fixed electrode 16 and the movable second bottom electrode 24.

When a voltage is applied between the first bottom electrode 22 and first top electrode 32 of the first beam 40 of the piezoelectric actuator, the first piezoelectric film 26 distorts to expand or to contract due to the piezoelectric effect. The first supporting film 36 provided on the first top electrode 32 does not exhibit the piezoelectric effect. Thus, the first beam 40 is displaced in the direction perpendicular to the surface of the substrate 10 by expansion or contraction of the first piezoelectric film 26. In the description below, it is premised that, when positive and negative voltages are applied to the first top electrode 32 in reference to the bottom electrode 22, tensile stress and compression stress are generated in the first piezoelectric film 26, respectively. For example, by expansion of the first piezoelectric film 26 caused by tensile stress, the first beam 40 bends in the direction away from the surface of the substrate 10. On the other hand, by contraction of the first piezoelectric film 26 caused by compression stress, the first beam 40 bends toward the surface of the substrate 10.

Usually, in the first and second piezoelectric films 26, 28 of the first and second beams 40, 42, warpage due to residual stress caused in the deposition process occurs. As shown in expression (2), the warpage of the piezoelectric actuator, which results from the residual stress, is proportional to a square of the length of the actuator. In a three dimensional view, the first and second beams 40, 42 of the piezoelectric actuator warp along a parabola taking the fixed portion 46 as a center, with respect to the substrate 10.

Consequently, as shown in FIG. 1, the piezoelectric actuator is built by the first and second beams 40, 42 using a folded structure. As a result, the fixed end 44 and the working end 48 can be located adjacent to each other. The first and second beams 40, 42 individually warp in proportion to a square of the beam length Lb. However, the beam interval Lt is shorter than the beam length Lb. Thus, it is possible to reduce the warpage of the working end 48, which results from the residual stress.

Moreover, the first and second beams 40, 42 have a laminated structure similar to each other. Hence, even if a vertically asymmetric residual stress occurs in the laminated structure, the warpage of the first beam 40 is cancelled with the warpage of the second beam 42 folded from the first beam 40. As a result, it is possible to decrease the displacement due to the warpage occurring between the fixed end 44 and the working end 48 to a maximum.

Moreover, as shown in expression (1), a movable range of the working end 48 of the piezoelectric actuator is proportional to the square of the beam length Lb. In the piezoelectric actuator with the folded structure, shown in FIG. 1, the effective length of the actuator becomes the beam interval Lt between the fixed end 44 and the working end 48. If each of the top electrode and the bottom electrode is not separated across the first and second beams as in a usual piezoelectric actuator, the shorter the beam interval Lt, the smaller the movable range of the working end. Thus, the displacement due to the bend of the first beam 40 is cancelled with the displacement due to the bend of the second beam 42.

In the embodiment of the present invention, the first bottom electrode 22 is isolated from the second bottom electrode 24. In a similar way, the first top electrode 32 is also isolated from the second top electrode 34. For example, when a drive voltage is applied between the first bottom electrode 22 and the first top electrode 32, the first beam 40 bends due to the piezoelectric strain generated in the first piezoelectric film 26. However, in the second piezoelectric film 28, the piezoelectric strain is not generated because the drive voltage is not applied to the second piezoelectric film 28. Thus, the second beam 42 does not bend.

Figure 7:
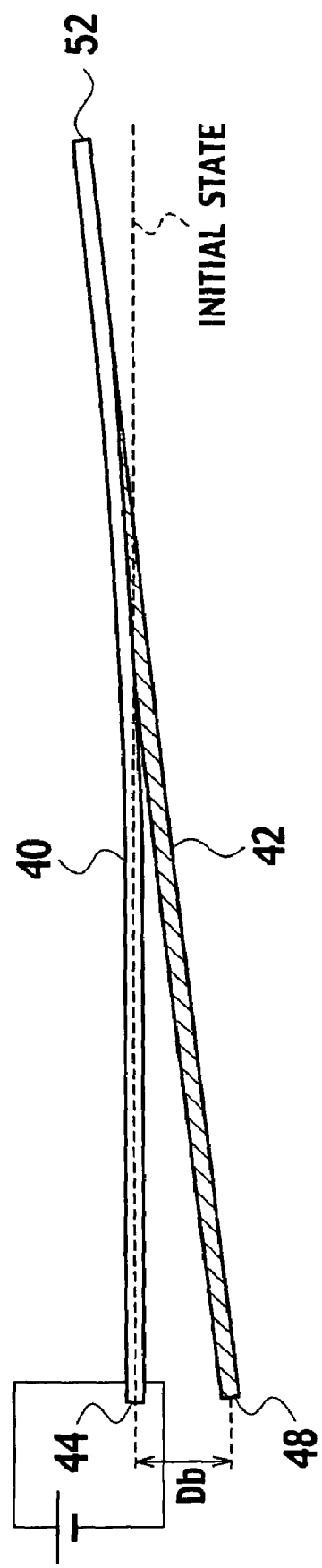
FIG. 7 is a schematic view showing an example of a piezoelectric drive of the piezoelectric actuator according to the embodiment of the present invention.

For example, when the first and second piezoelectric films 26, 28 have a negligible residual stress, as shown in FIG. 7, in an initial state where the drive voltage is not applied, each of the first and second beams 40, 42 scarcely warp, being substantially straight. When a positive drive voltage is applied to the first top electrode 32 in reference to the first bottom electrode 22 shown in FIG. 1, the first beam 40 supported by the fixed end 44 bends in a parabolic shape. The second beam 42 is kept straight. As a result, with respect to the fixed end 44, while the connecting end 52 is displaced upward, the working end 48 is displaced downward with a displacement Db. Similarly to the displacement of the connecting end 52, the displacement Db of the working end 48 is also provided by expression (1). Therefore, it is possible to control the displacement of the working end 48 with good reproducibility and high precision by the drive voltage applied to the first beam 40.

Figure 8:
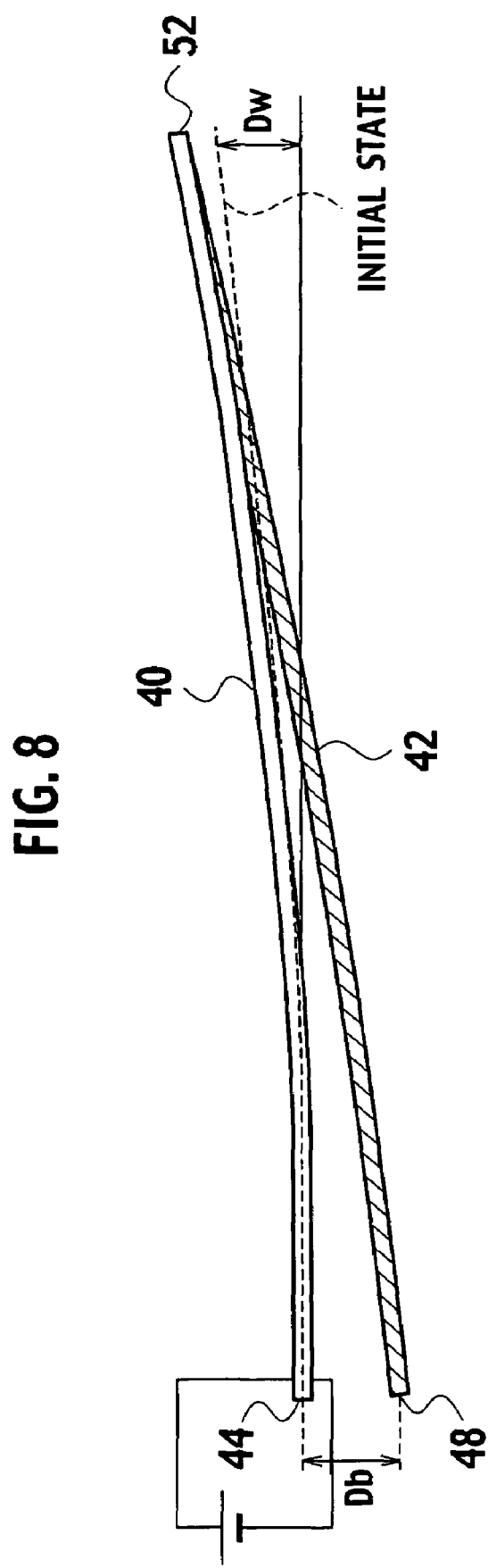
FIG. 8 is a schematic view showing another example of the piezoelectric drive of the piezoelectric actuator according to the embodiment of the present invention.

When the residual stresses of the first and second piezoelectric films 26, 28 can not be negligible, for example, as shown in FIG. 8, in the initial state where the drive voltage is not applied, the first and second beams 40, 42 are displaced upward in a parabolic shape with a warpage Dw. In the initial state, the working end 48 is located at substantially the same height as the fixed end 44. When a positive drive voltage is applied to the first top electrode 32 in reference to the first bottom electrode shown in FIG. 1, the first beam 40 supported by the fixed end 44 further bends in the parabolic shape. The second beam 42 is kept in the initial state. As a result, with respect to the fixed end 44, while the connecting end 52 is displaced upward, the working end 48 is displaced downward with a displacement Db. Similarly to the displacement of the connecting end 52, the displacement Db of the working end 48 is also represented by expression (1). Thus, even if each of the first and second beams 40, 42 warp in the initial state due to the residual stress, it is possible to control the displacement Db of the working end 48 with good reproducibility and high precision by the drive voltage applied to the first beam 40.

In the embodiment of the present invention, with regard to the first and second beams 40, 42, the structures, materials, thicknesses, and the like, in the direction perpendicular to the surface of the substrate 10, are the same within a range of manufacturing errors. If the laminated structures of the first and second beams 40, 42 are the same, it is possible to cancel the warpage due to the residual stress by the folded structure. However, the laminated structures of the first and second beams 40, 42 may differ from each other. For example, it is permissible when a difference in the geometric moment of inertia per unit width of the first and second beams 40, 42 with respect to an axis horizontal to the surface of the substrate 10, is within about 20%, desirably, within about 5%. When the difference in the geometric moment of inertia is within about 20%, the warpage of the working end 48 with respect to the fixed end 44 may be within about 20% of the movable range, which is within an allowable range of the drive voltage control.

Moreover, it is desirable that cross sections of the first and second beams 40, 42 are rectangular in a lateral direction parallel to the surface of the substrate 10, which is orthogonal to the longitudinal direction of the first and second beams 40, 42. If the cross sections are rectangular, the residual stresses of the first and second beams 40, 42 maybe substantially the same. Even if the lateral cross sections are not rectangular, it is permissible when side faces of the respective cross sections of the first and second beams 40, 42 are analogous to each other.

Moreover, although description is made on the assumption that the respective beam lengths of the first and second beams 40, 42 are approximately the same, the beam lengths may differ from each other. If a ratio of the beam interval between the fixed end 44 and the working end 48 to the beam length between the working end 48 and the connecting end 52 is about one or less, desirably, about one third or less, an effect of such cancellation of the warpage due to the residual stress may be achieved.

A manufacturing method of a variable capacitor using a piezoelectric actuator according to the embodiment of the present invention is described with reference to plan views and cross-sectional views as shown in FIGS. 9 to 16. Here, each cross-sectional view used in the description corresponds to the cross section from the X—X line shown in FIG. 9.

Figure 9:
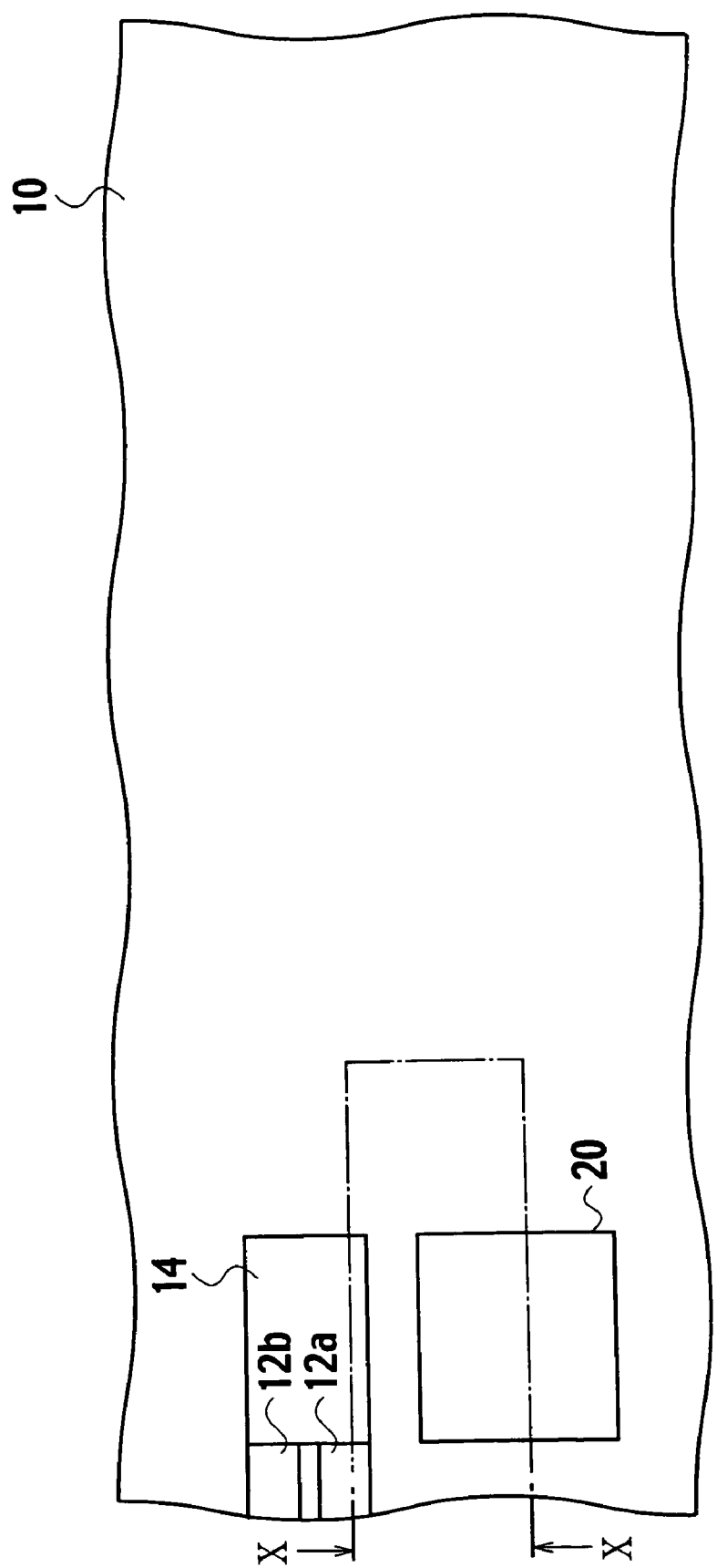
FIG. 9 is a plan view showing an example of a manufacturing method of the piezoelectric actuator according to the embodiment of the present invention.
Figure 10:
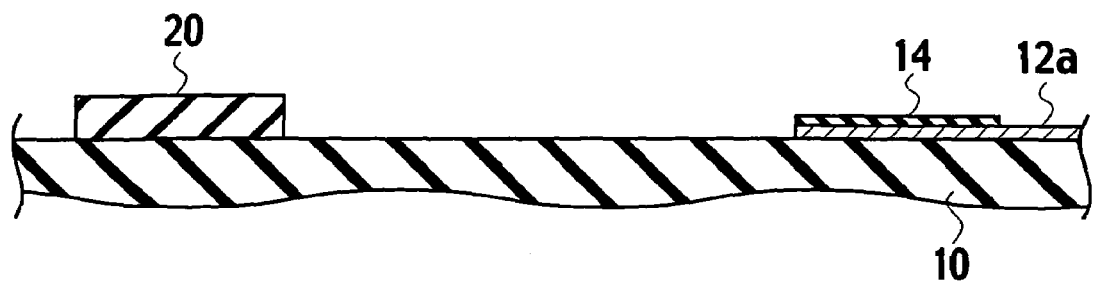
FIGS. 10 to 16 are cross-sectional views showing an example of the manufacturing method of the piezoelectric actuator according to the embodiment of the present invention.

For example, by plasma chemical vapor deposition (plasma CVD) and the like, an insulating film, such as $SiO_2$, is deposited at a thickness of about one Mm on a surface of a substrate 10, such as an insulating glass substrate. As shown in FIGS. 9 and 10, the deposited insulating film is selectively removed by photolithography, etching and the like, so as to form an anchor 20. By a lift-off process and the like, a metal film, such as Au, is selectively deposited at a thickness of about 200 nm by vacuum deposition. Thereafter, conductor films 12a, 12b are formed. Moreover, the insulating film, such as $SiO_2$, deposited at a thickness of about five nm by plasma CVD and the like, is selectively removed by photolithography, reactive ion etching (RIE), and the like, to form a dielectric film 14.

Figure 11:
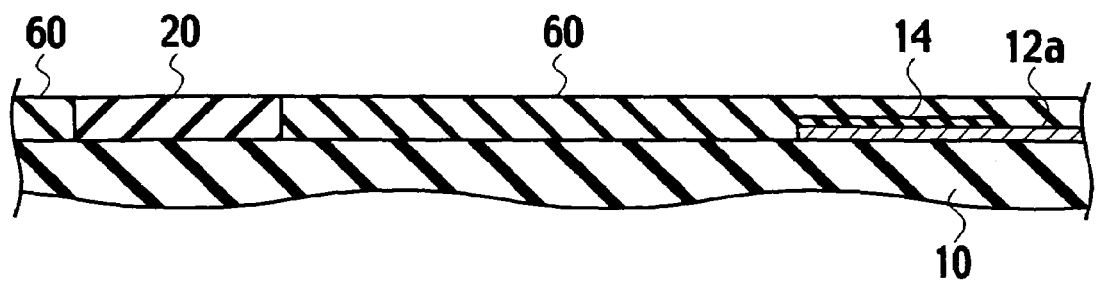

By plasma CVD and the like, an insulating film, such as phosphor-silicate glass (PSG), is deposited on the surface of the substrate 10 so as to bury the anchor 20, the dielectric film 14, the conductor film 12a, the conductor film 12b (not shown), and the like. As shown in FIG. 11, by chemical-mechanical polishing (CMP) and the like, the insulating film is planarized so as to expose a surface of the anchor 20. Thus, a sacrificial layer 60 is formed. The dielectric film 14, the conductor film 12a and the like are covered with the sacrificial layer 60.

Figure 12:
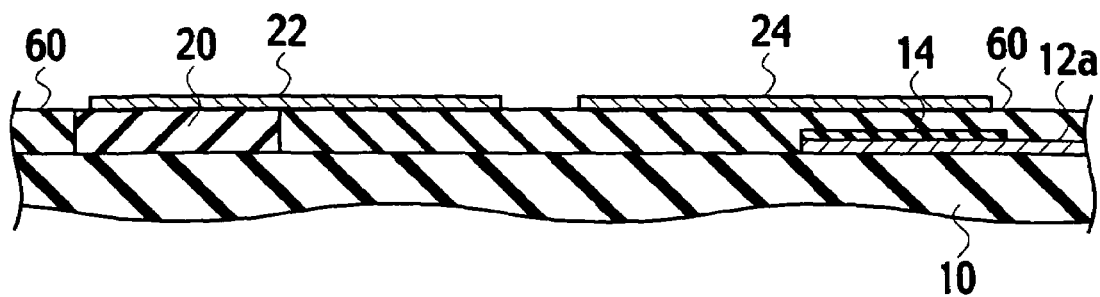

As shown in FIG. 12, by a lift-off process, vacuum deposition, and the like, a metal film, such as Au, is selectively deposited at a thickness of about 200 nm, to form first and second bottom electrodes 22, 24 extended on the sacrificial layer 60. An end of the first bottom electrode 22 is provided on the anchor 20. An end of the second bottom electrode 24 is provided above the dielectric film 14.

Figure 13:
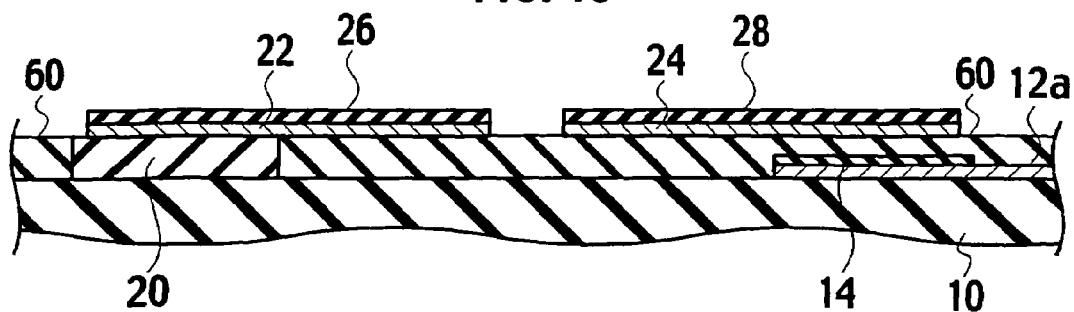

By sputtering and the like, a piezoelectric film, such as AlN oriented along the c-axis of the hexagonal crystal, is deposited at a thickness of about 500 nm on the sacrificial layer 60 on which the first and second bottom electrodes 22, 24 are formed. As shown in FIG. 13, the piezoelectric film is selectively removed by photolithography, RIE, and the like, to form first and second piezoelectric films 26, 28 on the first and second bottom electrodes 22, 24, respectively.

Figure 14:
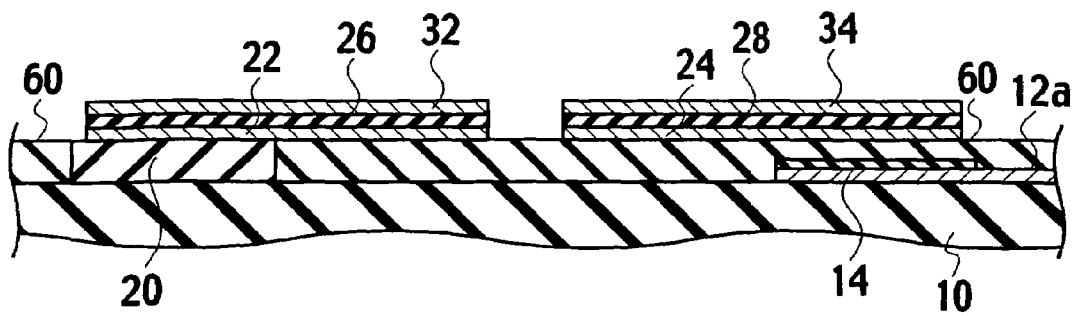

As shown in FIG. 14, by a lift-off process, vacuum deposition, and the like, a metal film, such as Au, is selectively deposited at a thickness of about 200 nm, to form first and second top electrodes 32, 34 on the first and second piezoelectric films 26, 28.

Figure 15:
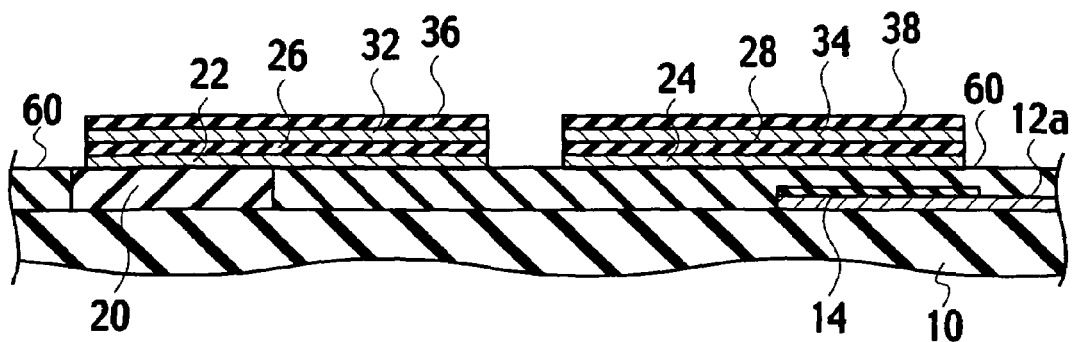

By CVD and the like, a polycrystalline silicon (poly-Si) film or the like is deposited on surfaces of the sacrificial layer 60, the first and second top electrodes 32, 34. As shown in FIG. 15, by photolithography, RIE, and the like, first and second supporting films 36, 38 are formed on the first and second top electrodes 32, 34, respectively.

Figure 16:
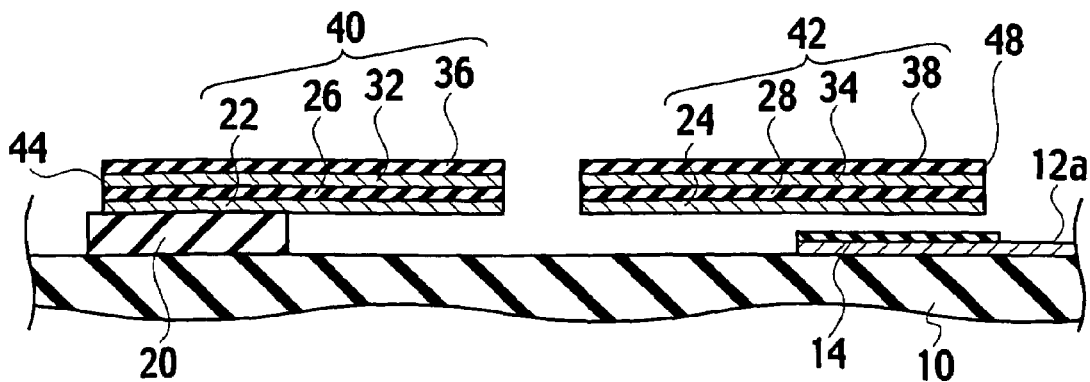

Subsequently, wet etching is implemented using an etchant including hydrofluoric acid (HF). Materials such as poly-Si, Au and AlN, are not dissolved in HF. Moreover, an etching rate for PSG used for the sacrificial layer 60 is as faster as about ten times or more than $SiO_2$ used for the anchor 20. Hence, the sacrificial layer 60 is selectively removed by wet etching, as shown in FIG. 16, to form a first beam 40 having a fixed end 44 fixed on the anchor 20, and a second beam 42 having a working end 48 facing the conductor film 12a and the dielectric film 14. Thus, a variable capacitor using the piezoelectric actuator according to the embodiment of the present invention, shown in FIG. 1, is manufactured.

Each of the first and second beams 40, 42 has a length of about 300 μm, a width of about 40 μm, and a thickness of about 1.9 μn. The anchor 20 has a square shape of about 40 μm on a side, and a thickness of about one μm. Note that, because the first and second piezoelectric films 26, 28 are deposited simultaneously, the polarization directions of the first and second piezoelectric films 26, 28 are the same.

The shape of the variable capacitor is measured by laser microscope. In the first and second beams 40, 42, the connecting end 52 warps to a height of about 15.8 μm from the surface of the substrate 10 due to the residual stress. A bottom surface of the second bottom electrode 24 at the working end 48 is spaced with a spacing of about 1.2 μm from the surface of the substrate 10, which is close to the thickness of the anchor 20. In the embodiment of the present invention, since the first and second beams 40, 42 are manufactured in the same manufacturing process, the laminated structure can be manufactured within a range of in-plane variations in the deposition processes. Hence, it is possible to decrease the warpages of the first and second beams 40, 42 due to the residual stresses.

By applying a drive voltage of about 0 V to about three V between the first top electrode 32 and first bottom electrode 22 of the piezoelectric actuator, capacitance is measured between the terminals connected to the conductor films 12a, 12b of the fixed electrode 16 of the variable capacitor. As a result, an extremely wide and continuous variable range of about 250 times between the minimum capacitance of about 0.22 pF and the maximum capacitance of about 51 pF, is achieved.

Note that PSG is used as the sacrificial layer 60 in the embodiment of the present invention. However, the material of the sacrificial layer 60 is not limited. For example, as the sacrificial layer 60, an inorganic material, a metal material, an organic material or the like, which is capable of selective etching for the materials of the anchor 20, the first and second beams 40, 42, and the like, may be used.

Moreover, an example of the variable capacitor using the piezoelectric actuator according to the embodiment of the present invention is described. The piezoelectric actuator can be applied not only to the variable capacitor but also to a micro-electromechanical device, such as a switch. For example, using the same structure as shown in FIG. 1, the second bottom electrode 24 of the working end 48 is brought into contact with the dielectric film 14 of the fixed electrode 16. Thus, the piezoelectric actuator can be used as a capacitive type switch. Moreover, using a structure without the dielectric film 14, the piezoelectric actuator can be used as a DC contact type switch.

Figure 17:
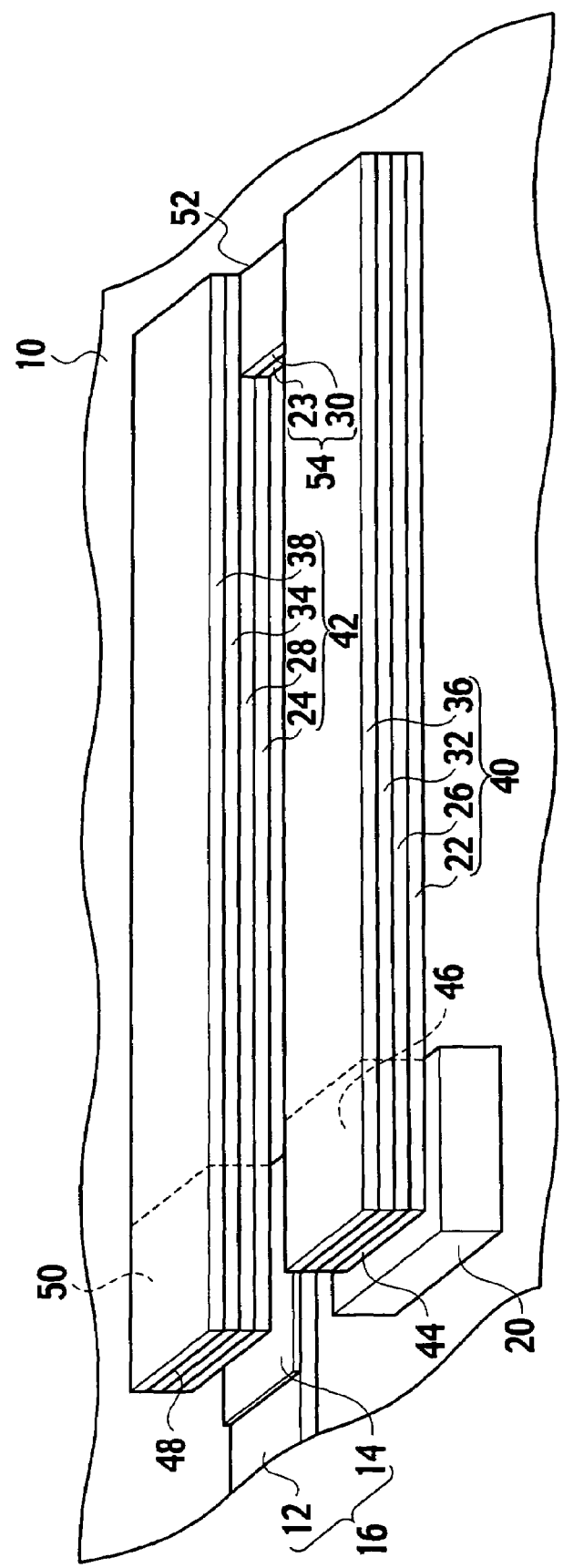
FIG. 17 is a perspective view showing another example of the piezoelectric actuator according to the embodiment of the present invention.

Furthermore, in the embodiment of the present invention, the two conductor films 12a, 12b are used for the fixed electrode 16. For example, as shown in FIG. 17, a single conductor film 12 may be used for the fixed electrode 16. The first bottom electrode 22 is connected to the second bottom electrode 24 through a bottom electrode 23 under a piezoelectric film 30 of the connecting portion 54. When using the piezoelectric actuator as a variable capacitor or a switch, a change in the capacitance or a contact between the conductor film 12 of the fixed electrode 16 and the first bottom electrode 22 in the fixed portion 46 is detected. As described above, the first and second bottom electrodes 22, 24 are connected so as to be used as one of the electrodes of a variable capacitor or a switch. However, the first top electrode 32 is isolated from the second top electrode 34. Accordingly, an electric field is not applied to the second piezoelectric film 28 during application of the drive voltage, keeping the second beam 42 in the initial state. Hence, it is possible to control the displacement of the working end 48 of the second beam 42 with good reproducibility and high precision by the drive voltage applied to the first beam 40.

(First Modification)

Figure 18:
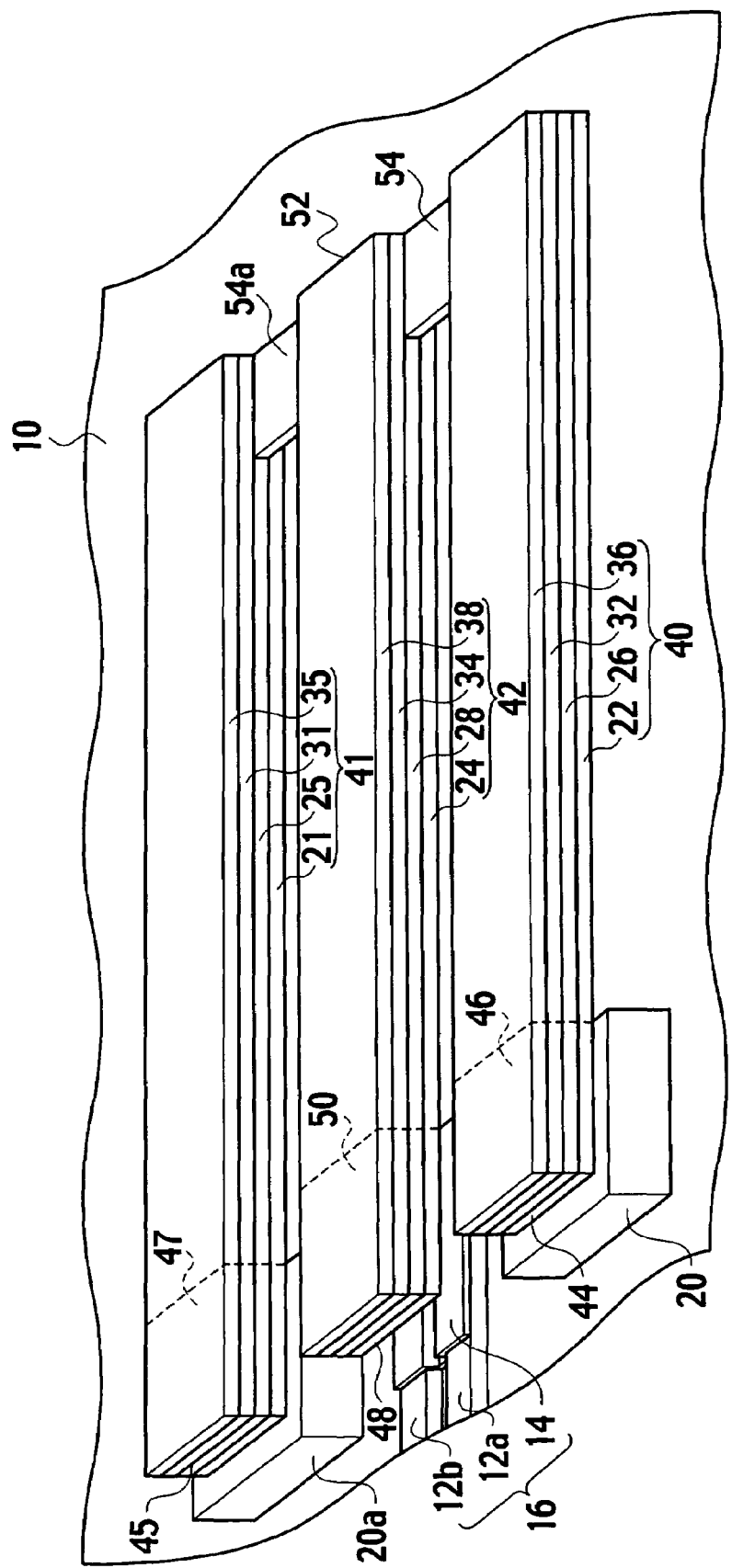
FIG. 18 is a perspective view showing an example of the piezoelectric actuator according to the first modification of the embodiment of the present invention.
Figure 19:
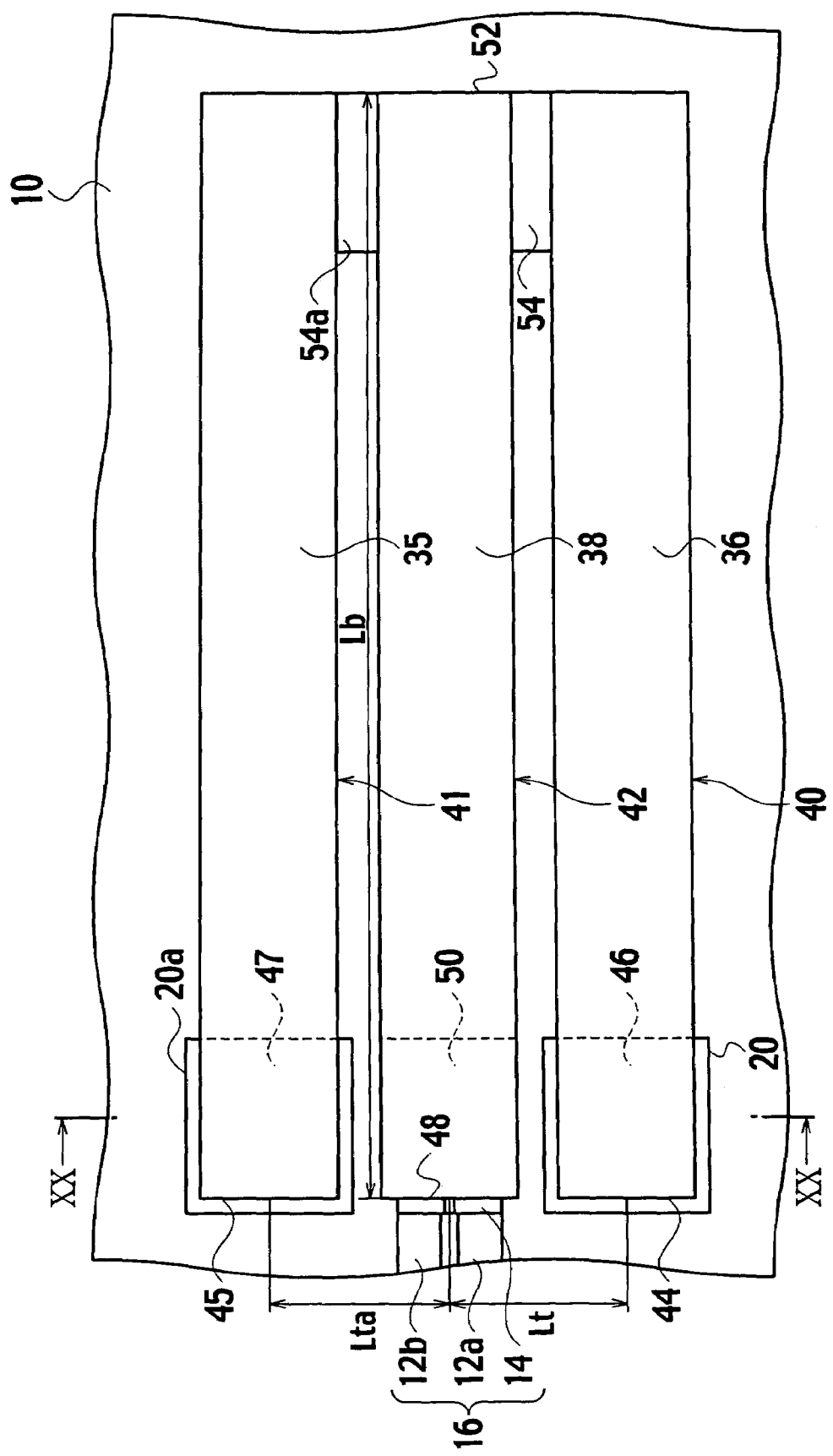
FIG. 19 is a schematic plan view showing an example of the piezoelectric actuator according to the first modification of the embodiment of the present invention.

A piezoelectric actuator according to a first modification of the embodiment of the present invention, as shown in FIG. 18, includes a first beam 40, a second beam 42, and a third beam 41. The third beam 41 is placed so as to face the first beam 40 to sandwich with the second beam 42. The third beam 41 is extended from a fixed end 45 of a fixed portion 47, which is fixed to an anchor 20a on a substrate 10, to a connecting end 52 of a connecting portion 54a. A working end 48 is placed adjacent to the fixed ends 44, 45 between the fixed ends 44, 45. As shown in FIG. 19, a beam interval Lta between the second and third beams 42, 41 is the same as a beam interval Lt between the first and second beams 40, 42 within a range of manufacturing errors. The beam interval Lt is shorter than a beam length Lb.

As shown in FIG. 18, the third beam 41 includes a third bottom electrode 21, a third piezoelectric film 25 provided on the third bottom electrode 21, a third top electrode 31 provided on the third piezoelectric film 25, and a third supporting film 25 provided on the third top electrode 31. The first, second and third piezoelectric films 26, 28, 25 are connected to one another through the connecting portions 54, 54a. All of the first, second and third piezoelectric films 26, 28, 25, and the connecting portions 54, 54a are formed by a continuous piezoelectric layer.

The piezoelectric actuator according to the first modification of the embodiment of the present invention is different from the embodiment in including the third beam 41. Other configurations are similar to the embodiment of the present invention. Thus, duplicated descriptions are omitted.

Figure 20:
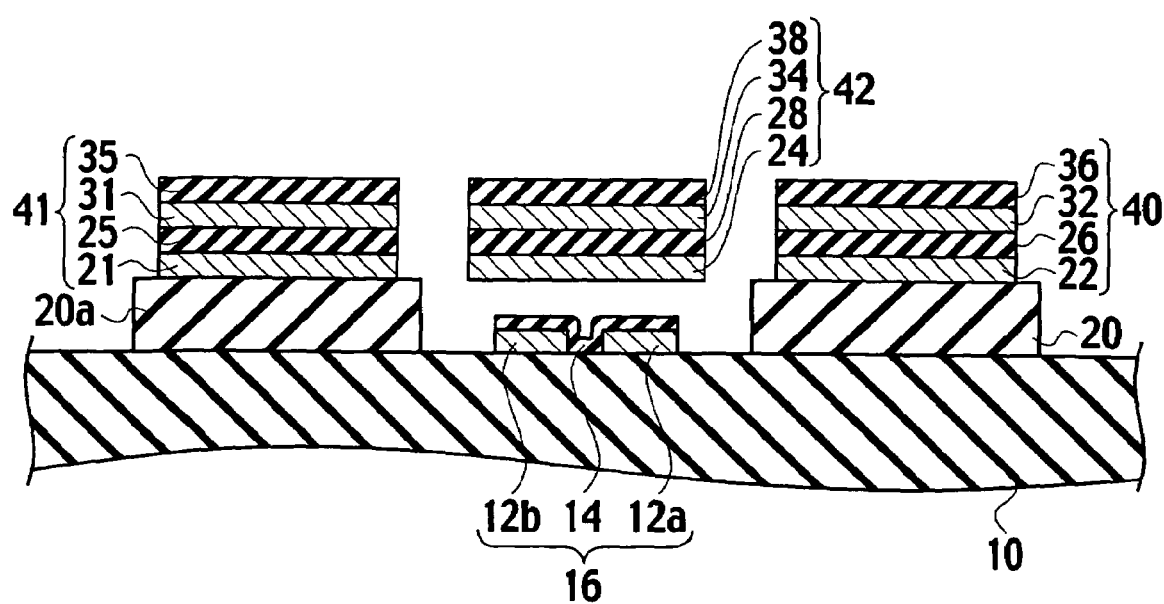
FIG. 20 is a schematic view showing an example of a cross-section along a line XX—XX of the piezoelectric actuator of FIG. 19.

As shown in FIG. 20, in the first modification of the embodiment of the present invention, the second bottom electrode 24 of the second beam 42 serves as the movable electrode. For example, by applying a common potential to the first and third bottom electrodes 22, 21, a positive drive voltage is applied to the first and third top electrodes 32, 31. By application of the positive drive voltage, the first and third beams 40, 41 bend upward away from the surface of the substrate 10 in a parabolic shape. On the other hand, the second beam 42 is kept straight, and the working end 48 is displaced in a direction towards the substrate 10 located below the working end 48. The second beam 42 is disposed between the first and third beams 40, 41. Hence, when the second bottom electrode 24 of the working portion 50 is brought into contact with the fixed electrode 16 on the substrate 10 by a piezoelectric drive forth, a torsional stress applied to the connection portion 54 of the first, second and third beams 40, 42, 41 can be reduced to a large extent. As a result, a pressing force of the working portion 50 to the fixed electrode 16 is increased.

For a variable capacitor using a piezoelectric actuator according the first modification of the embodiment of the present invention, it is possible to increase the maximum capacitance value. For a DC contact type switch using a piezoelectric actuator according the first modification of the embodiment, there is an advantage in reducing a contact resistance. Moreover, in the first modification of the embodiment, the working end 48 is located between the fixed ends 44, 45 fixed on the anchors 20, 20a. Thus, it is possible to further reduce an influence of the warpage in the working end 48.

(Second Modification)

Figure 21:
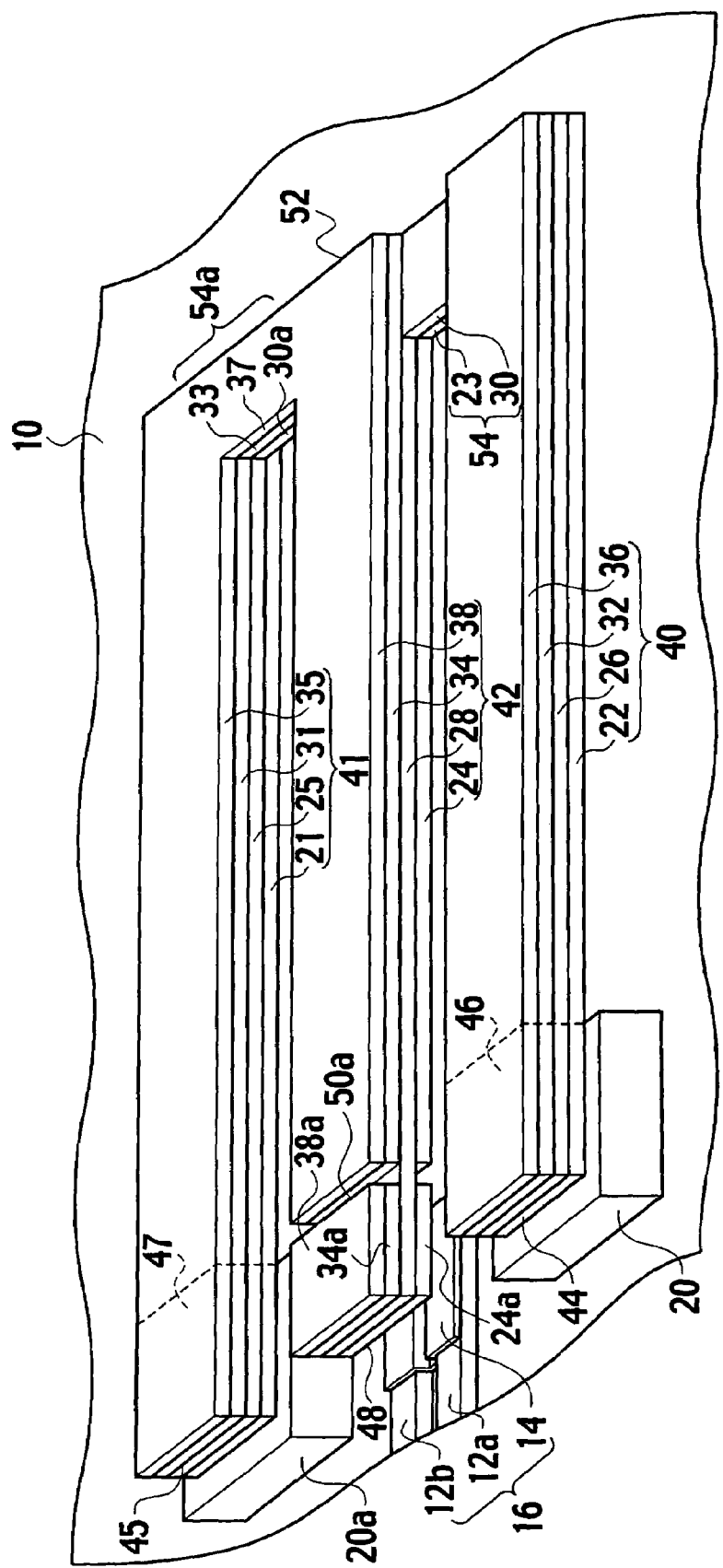
FIG. 21 is a perspective view showing an example of a piezoelectric actuator according to a second modification of the embodiment of the present invention.

A piezoelectric actuator according to a second modification of the embodiment of the present invention, as shown in FIG. 21, includes the first beam 40, the second beam 42, and the third beam 41. The first piezoelectric film 26 is connected to the second piezoelectric film 28 through the piezoelectric film 30 of the connecting portion 54. The bottom electrode 23 is provided under the piezoelectric film 30. The first piezoelectric film 26 is connected to the third piezoelectric film 25 through a piezoelectric film 30a of the connecting portion 54a. A top electrode 33 is provided on the piezoelectric film 30a. The second and third supporting films 38, 35 are connected through a supporting film 37 on the top electrode 33. Moreover, in a working portion 50a of the second beam 42, movable electrodes 24a, 34a and a movable supporting film 38a, which are isolated from the second bottom electrode 24, the second top electrode 34 and the second supporting film 38, respectively, are provided.

Figure 22:
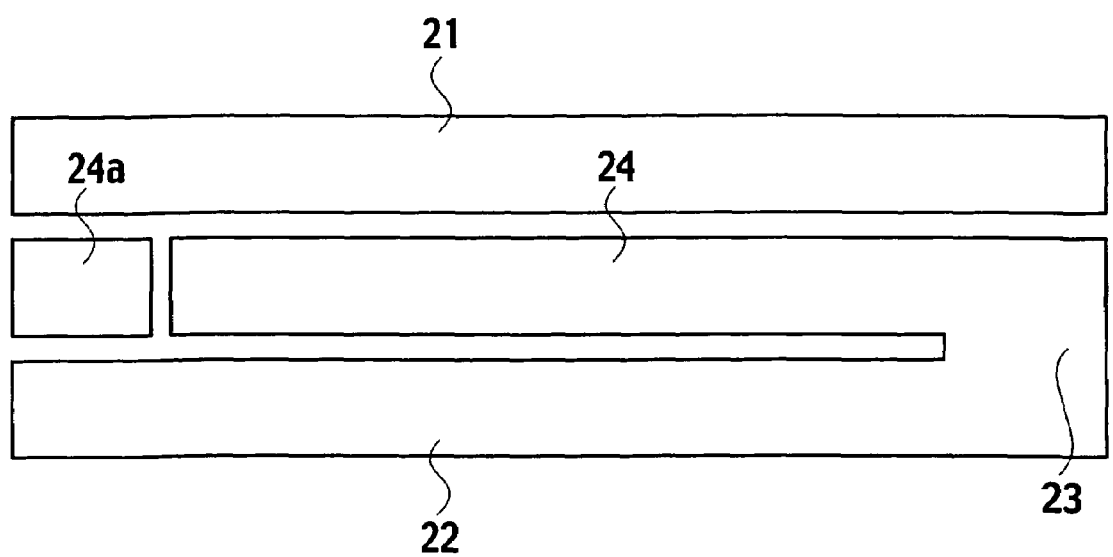
FIG. 22 is a perspective view showing an example of a bottom electrode of the piezoelectric actuator according to the second modification of the embodiment of the present invention.
Figure 23:
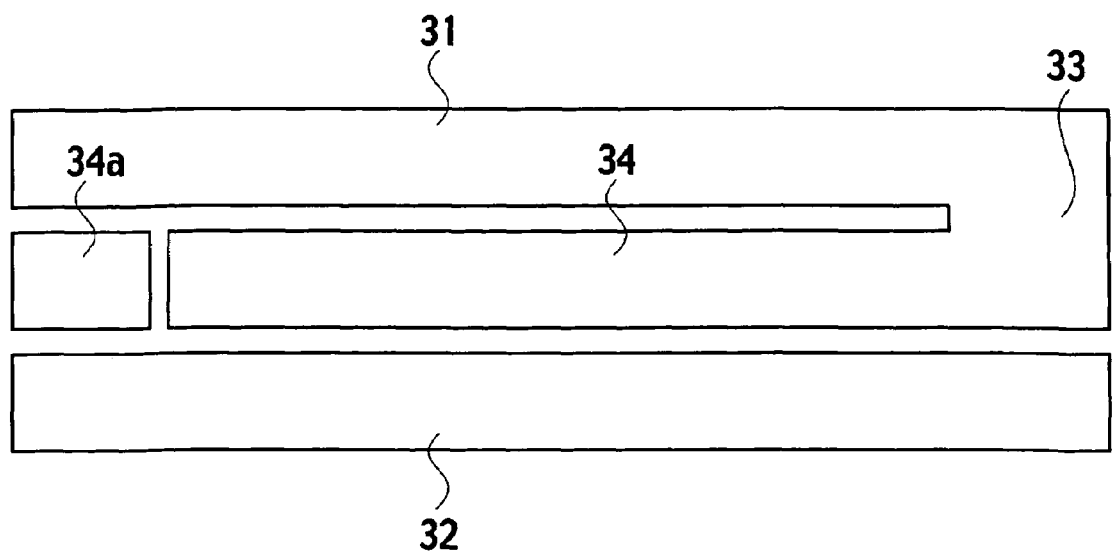
FIG. 23 is a perspective view showing an example of a top electrode of the piezoelectric actuator according to the second modification of the embodiment of the present invention.

As shown in FIG. 22, the first and second bottom electrodes 22, 24 are connected through the bottom electrode 23. The third bottom electrode 21 is isolated from the first and second bottom electrodes 22, 24. As shown in FIG. 23, the second and third top electrodes 34, 31 are connected through the top electrode 33. The first top electrode 32 is isolated from the second and third top electrodes 34, 31.

The piezoelectric actuator according to the second modification of the embodiment of the present invention is different from the first modification of the embodiment in that the first bottom electrode 22 is connected to the second bottom electrode 24, and that the second top electrode 34 is connected to the third top electrode 31. Other configurations are as in the first modification of the embodiment. Thus, duplicated descriptions are omitted.

In the second modification, by applying a common potential to the third bottom electrode 21 and the third top electrode 31, a positive drive voltage is applied to the first bottom electrode 22 and the first top electrode 32. Hence, the first and third beams 40, 41 connected to the fixed ends 44, 45 do not bend. On the other hand, the common potential and the positive dive voltage are applied to the second top electrode 34 and the second bottom electrode 24, respectively. Hence, the second beam 42 bends downward. Thus, only the second beam 42 bends to displace the working portion 50a. As a result, a mass of the bending portion is decreased, and the operation speed is increased. Hence, it is possible to achieve a high-speed operation of the piezoelectric actuator.

Note that, in the second modification, a DC voltage as the drive voltage is applied to the second bottom electrode 24 and second top electrode 34 of the second beam 42, the movable electrodes 24a, 34a of the working portion 50a are separated from other electrodes, so as to form floating electrodes.

(Third Modification)

Figure 24:
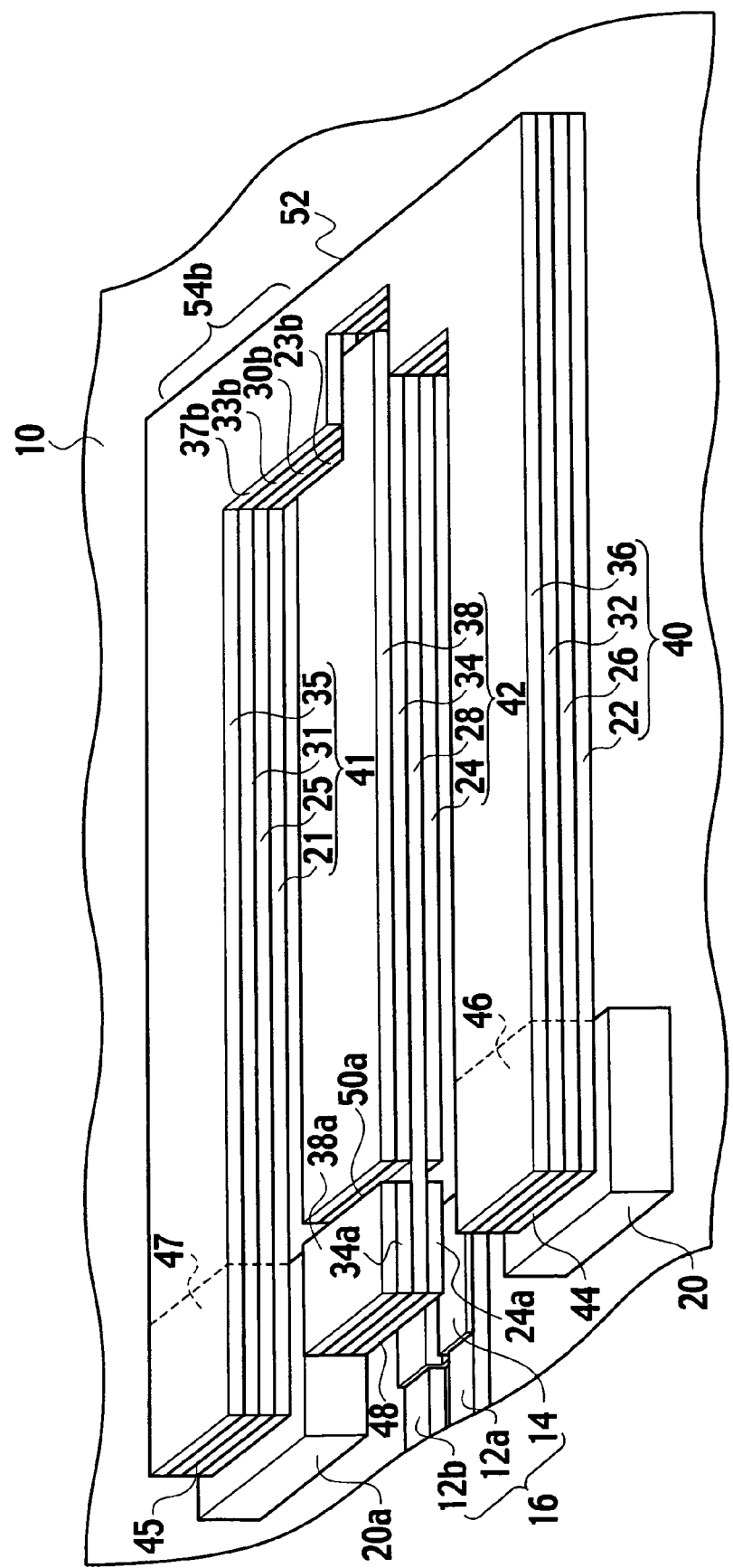
FIG. 24 is a perspective view showing an example of a piezoelectric actuator according to a third modification of the embodiment of the present invention.
Figure 25:
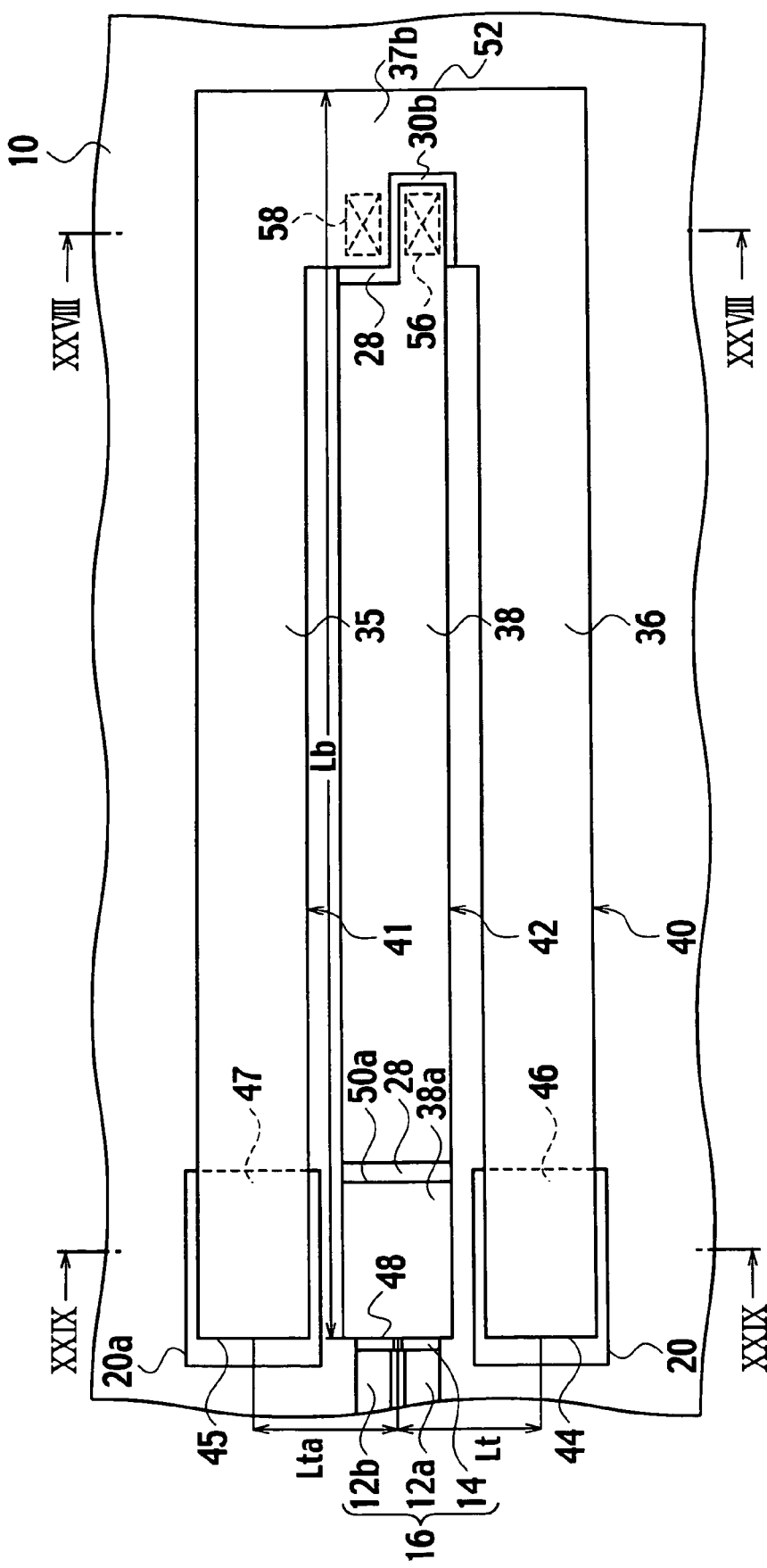
FIG. 25 is a schematic plan view showing an example of the piezoelectric actuator according to the third modification of the embodiment of the present invention.

A piezoelectric actuator according to a third modification of the embodiment of the present invention, as shown in FIG. 24, includes the first beam 40, the second beam 42, and the third beam 41. The first beams 40 is connected to the third beam 41 through a connecting portion 54b. As shown in FIG. 25, the second piezoelectric film 28 is connected to a piezoelectric film 30b of the connecting portion 54b. Moreover, plugs 56, 58 are buried below the supporting films 38, 37b.

Figure 26:
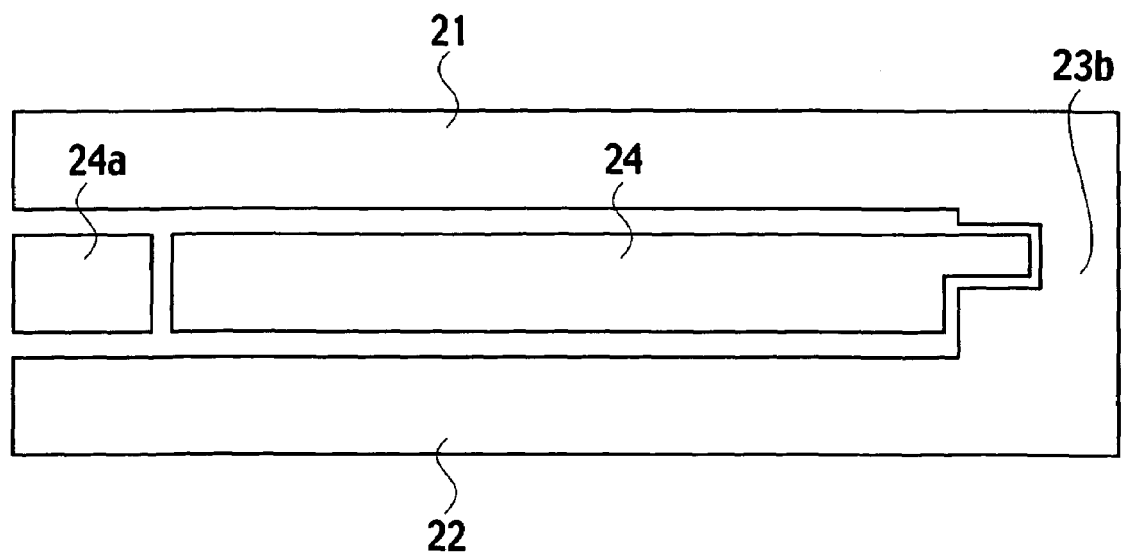
FIG. 26 is a perspective view showing an example of a bottom electrode of the piezoelectric actuator according to the third modification of the embodiment of the present invention.
Figure 27:
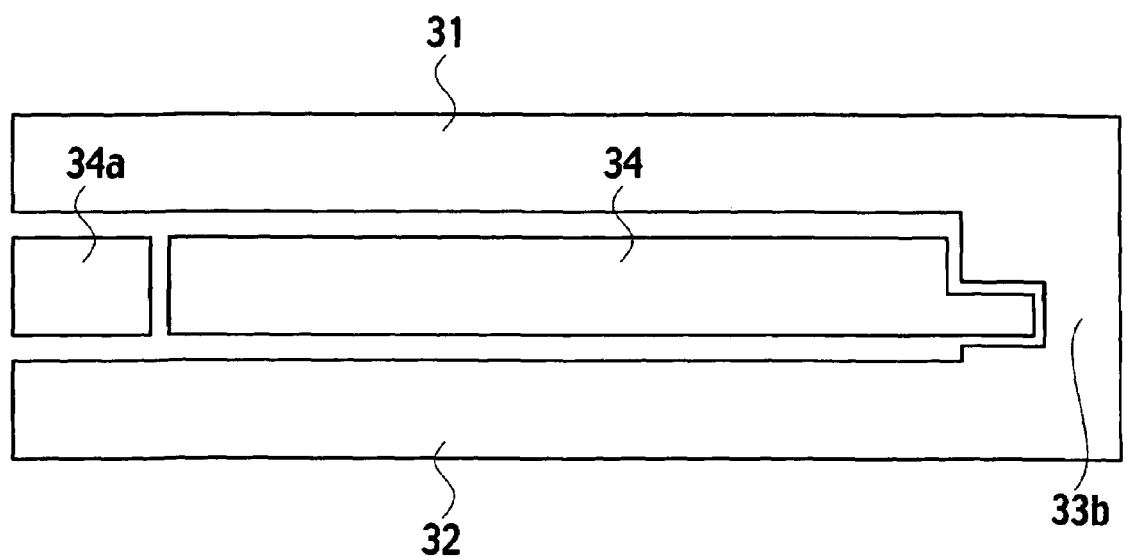
FIG. 27 is a perspective view showing an example of a top electrode of the piezoelectric actuator according to the third modification of the embodiment of the present invention.

As shown in FIG. 26, the first bottom electrode 22 is connected to the third bottom electrode 21 through a bottom electrode 23b. The second bottom electrode 24 is isolated from the first and third bottom electrodes 22,21. The movable electrode 24a is isolated from the second bottom electrode 24. As shown in FIG. 27, the first top electrode 32 is connected to the third top electrode 31 through a top electrode 33b. The second top electrode 34 is isolated from the first and third top electrodes 32, 31. The movable electrode 34a is isolated from the second top electrode 34.

Figure 28:
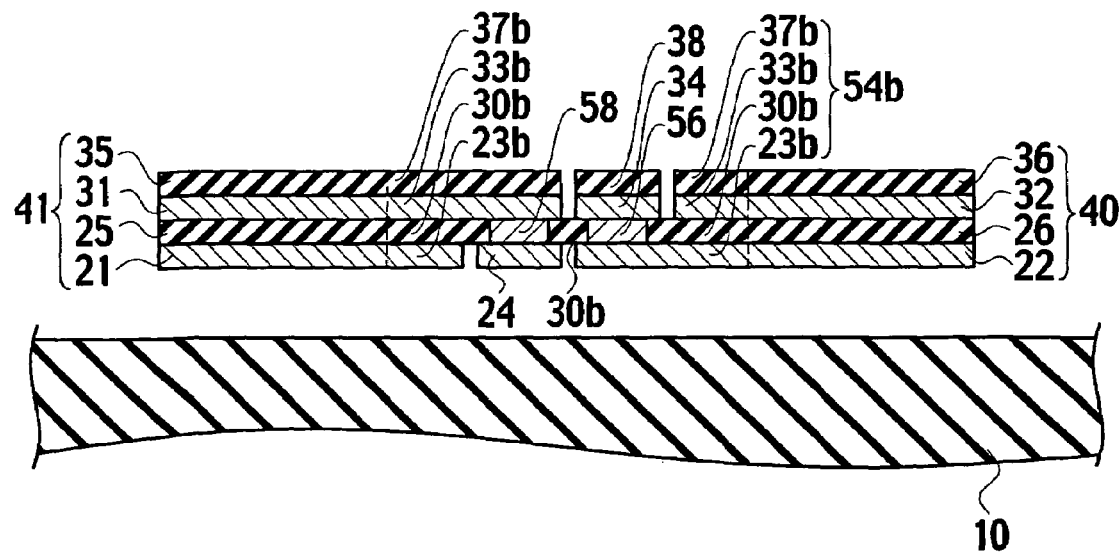
FIG. 28 is a schematic view showing an example of a cross section along a line XXVIII—XXVIII of the piezoelectric actuator of FIG. 25.

As shown in FIG. 28, each of the plugs 56, 58 is a metal, such as Au, buried in via holes provided in the piezoelectric film 30b of the connecting portion 54b. The plug 56 connects the second top electrode 34 of the second beam 42 and the bottom electrode 23b of the connecting portion 54b. Moreover, the plug 58 connects the second bottom electrode 24 and the top electrode 33b of the connecting portion 54b. Thus, the second bottom electrode 24 is connected to the first and third top electrodes 32, 31. The second top electrode 34 is connected to the first and third bottom electrodes 22, 21.

Figure 29:
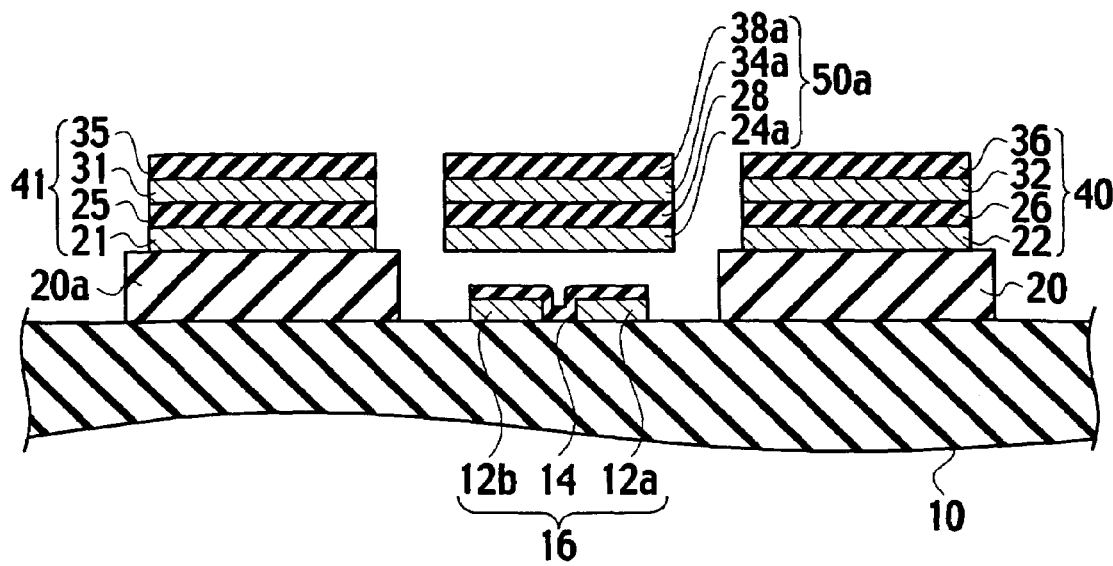
FIG. 29 is a schematic view showing an example of a cross section along a line XXIX—XXIX of the piezoelectric actuator of FIG. 25.

As shown in FIG. 29, the working portion 50a of the second beam 42 faces the fixed electrode 16 provided on the surface of the substrate 10. In the working portion 50a, the second piezoelectric film 28, the movable electrode 34a and the movable supporting film 38a are formed in sequence on the movable electrode 24a.

The piezoelectric actuator according to the third modification of the embodiment of the present invention is different from the first and second modifications in that the second bottom electrode 24 is connected to the first and third top electrodes 32, 31, and that the second top electrode 34 is connected to the first and third bottom electrodes 22, 21. Other configurations are similar to the first and second modifications. Thus, duplicated descriptions are omitted.

In the third modification of the embodiment, by applying a common potential to the first bottom electrode 22 and the third bottom electrode 21, a positive drive voltage is applied to the first top electrode 32 and the third top electrode 31. As a result, the first and third beams 40, 41 connected to the fixed ends 44, 45 bend upward with respect to the substrate 10. The common potential and the positive dive voltage are applied to the second top electrode 34 and the second bottom electrode 24, respectively. Accordingly, the second beam 42 bends downward. Since bending displacement by the piezoelectric drives of the first and third beams 40, 41 and bending displacement of the piezoelectric drive by the second beam 42 are summed up together, displacement at the working end 48 may be almost doubled. Thus, in a piezoelectric actuator according to the third modification of the embodiment, it is possible to increase the displacement of the piezoelectric drive.

(Fourth Modification)

Figure 30:
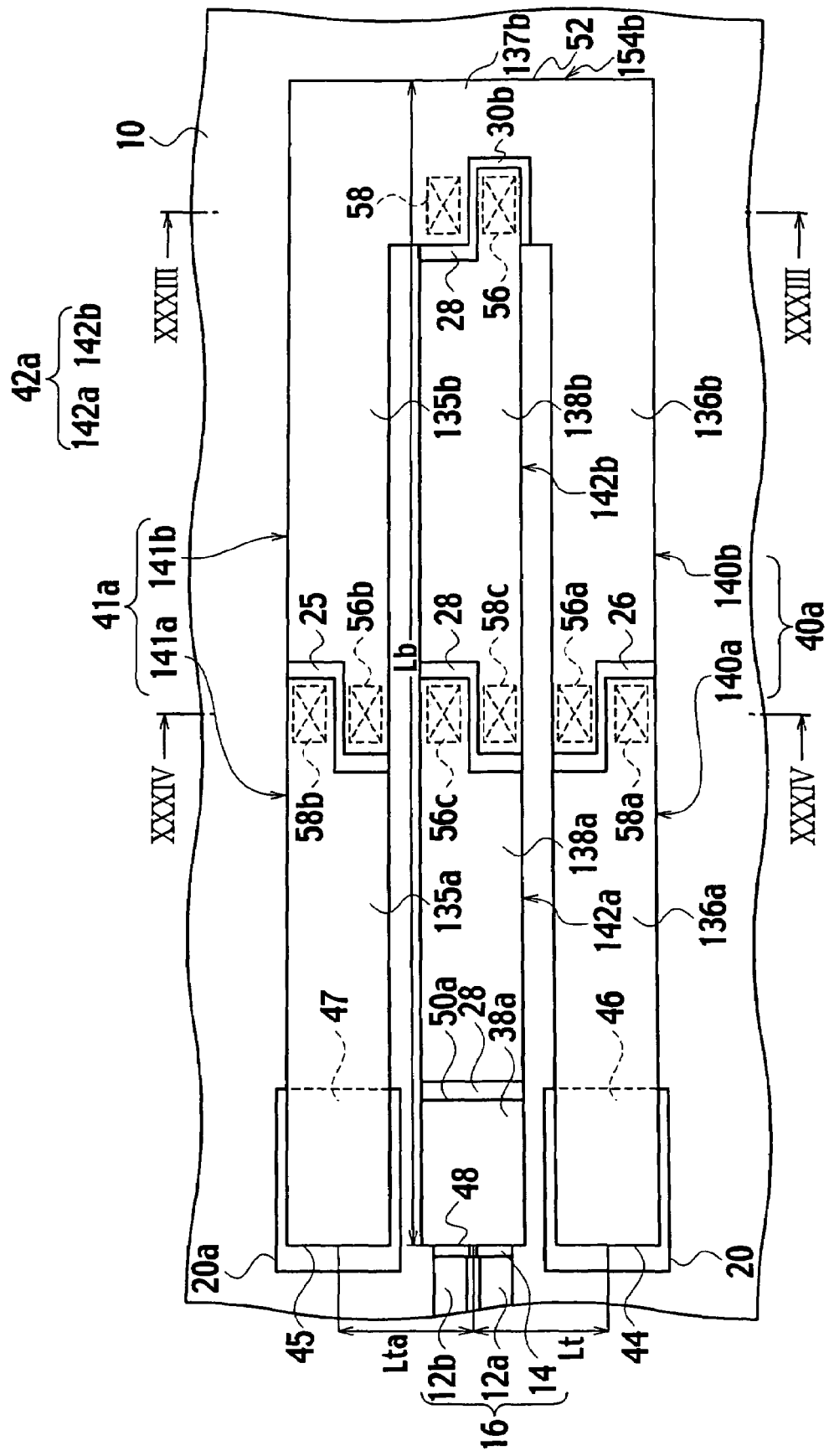
FIG. 30 is a schematic plan view showing an example of a piezoelectric actuator according to a fourth modification of the embodiment of the present invention.

A piezoelectric actuator according to a fourth modification of the embodiment of the present invention, as shown in FIG. 30, includes a first beam 40a having a first section 140a and a second section 140b, a second beam 42a having a first section 142a and a second section 142b, and a third beam 41a having a first section 141a and a second section 142b. The first beam 40a is connected to the third beam 41a through a connecting portion 154b. The second piezoelectric film 28 is connected to the piezoelectric film 30b of the connecting portion 154b. On the respective partitioned surfaces of the first to third beams 40a, 42a, 41a, first supporting films 136a, 136b, second supporting films 138a, 138b, and third supporting films 135a, 135b are provided. The first sections 140a, 142a, 141a, and the second sections 140b, 142b, 141b are partitioned at substantial center positions of the respective first to third beams 40a, 42a, 41a.

Moreover, the plugs 56, 58 are buried below the second supporting film 138b and a supporting film 137b. Plugs 58a, 56a are provided in the first section 140a and second section 140b of the first beam 40a. Plugs 58b, 56b are provided in the first section 141a and second section 141b of the third beam 41a. Plugs 56c, 58c are provided in the first section 142a and second section 142b of the second beam 42a.

Figure 31:
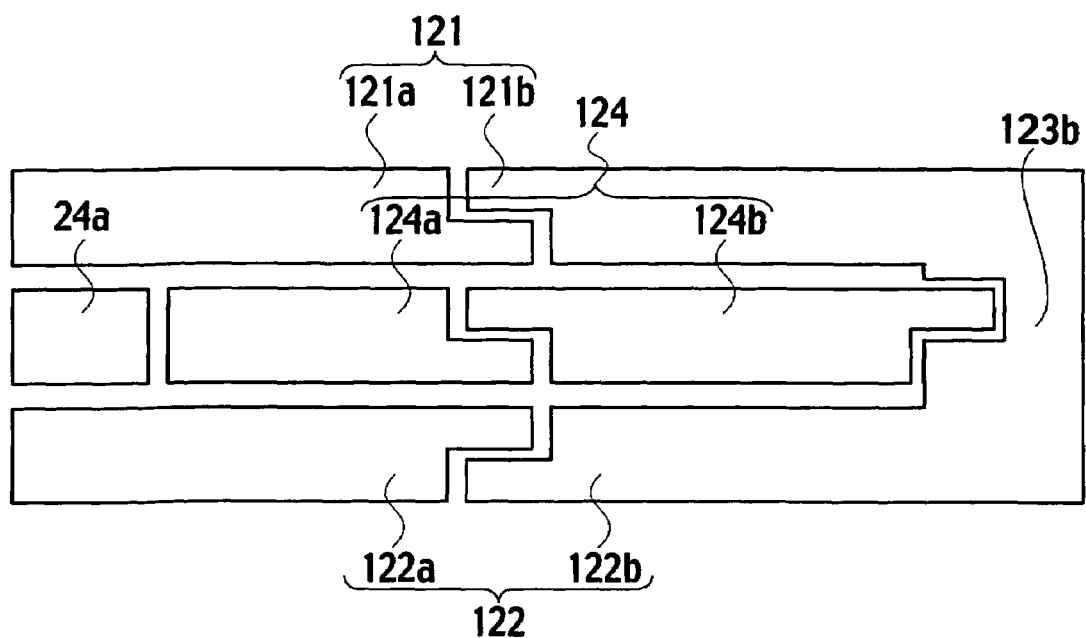
FIG. 31 is a perspective view showing an example of a bottom electrode of the piezoelectric actuator according to the fourth modification of the embodiment of the present invention.

As shown in FIG. 31, first to third bottom electrodes 122, 124, 121 of the first to third beams 40a, 42a, 41a are divided into first divided portions 122a, 124a, 121a and second divided portions 122b, 124b, 121b, respectively. The second divided portions 122b, 121b of the first and third bottom electrodes 122, 121 are connected to each other through a bottom electrode 123b. The second bottom electrode 124 is isolated from the first and third bottom electrodes 122, 121. The movable electrode 24a is isolated from the second bottom electrode 124.

Figure 32:
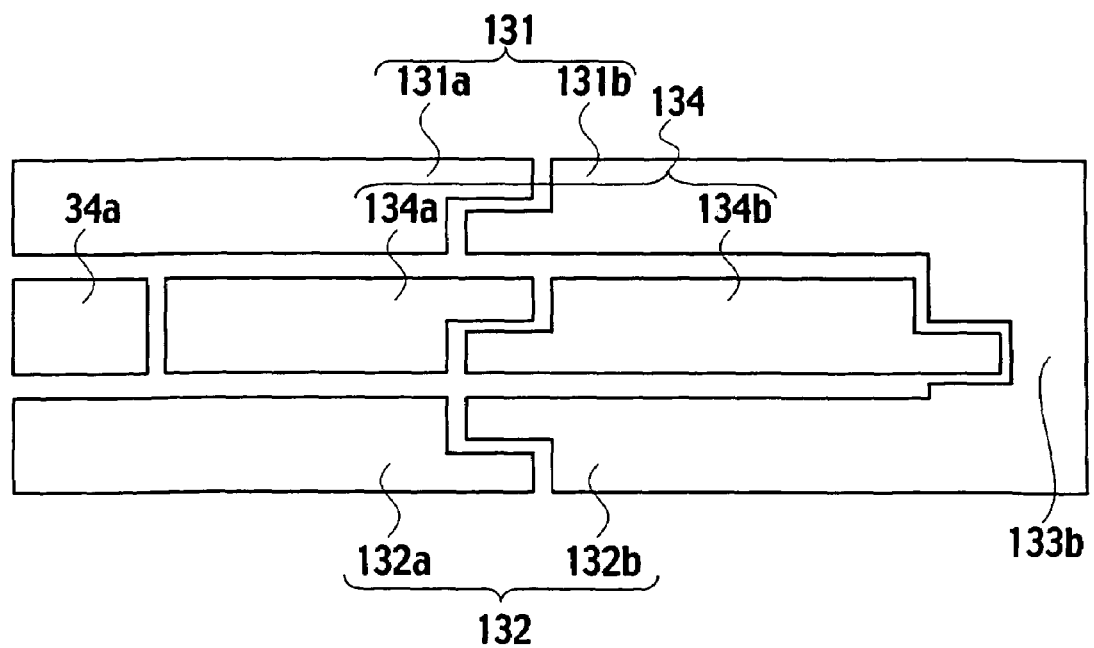
FIG. 32 is a perspective view showing an example of a top electrode of the piezoelectric actuator according to the fourth modification of the embodiment of the present invention.

Moreover, as shown in FIG. 32, first to third top electrodes 132, 134, 131 are divided into first divided portions 132a, 134a, 131a and second divided portions 132b, 134b, 131b, respectively. The second divided portions 132b, 131b of the first and third top electrodes 132, 131 are connected to each other through a top electrode 133b. The second top electrode 134 is isolated from the first and third top electrodes 132, 131. The movable electrode 34a is isolated from the second top electrode 134.

Figure 33:
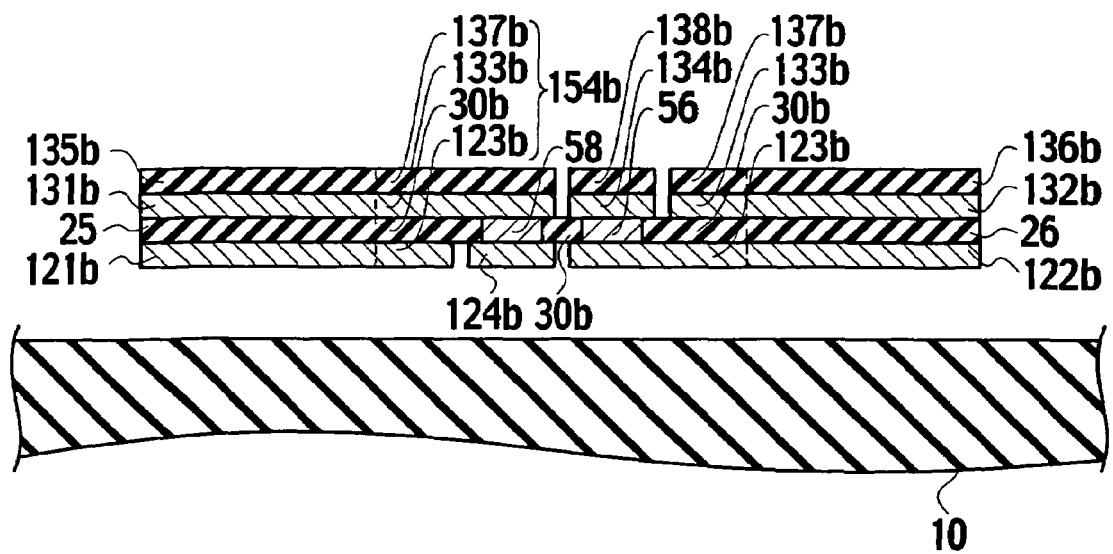
FIG. 33 is a schematic view showing an example of a cross section along a line XXXIII—XXXIII of the piezoelectric actuator of FIG. 30.

As shown in FIG. 33, each of the plugs 56, 58 is a metal, such as Au, buried in via holes provided in the piezoelectric film 30b of the connecting portion 154b. The plug 56 connects the second divided portion 134b of the second top electrode 134 of the second beam 42a and the bottom electrode 123b of the connecting portion 154b. The plug 58 connects the second divided portion 124b of the second bottom electrode 124 and the top electrode 133b of the connecting portion 154b. Hence, the second divided portion 124b of the second bottom electrode 124 is connected to the second divided portions 132b, 131b of the first and third top electrodes 132, 131. Moreover, the second divided portion 134b of the second top electrode 134 is connected to the second divided portions 122b, 121b of the first and third bottom electrodes 122, 121.

Figure 34:
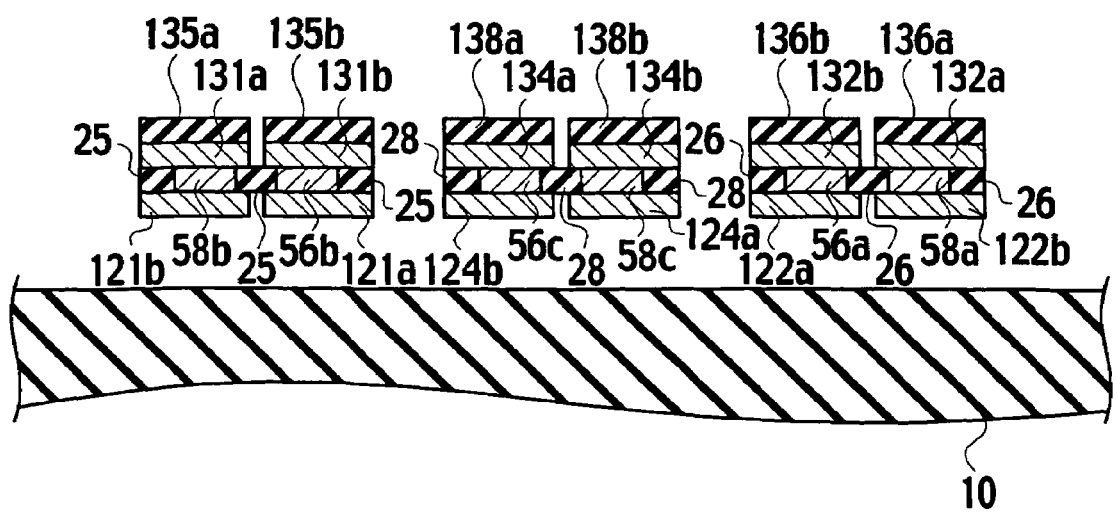
FIG. 34 is a schematic view showing an example of a cross section along a line XXXIV—XXXIV of the piezoelectric actuator of FIG. 30.

As shown in FIG. 34, the plug 56a connects the first divided portion 122a of the first bottom electrode 122 and the second divided portion 132b of the first top electrode 132. The plug 58a connects the second divided portion 122b of the first bottom electrode 122 and the first divided portion 132a of the first top electrode 132. The plug 56b connects the first divided portion 121a of the third bottom electrode 121 and the second divided portion 131b of the third top electrode 131. The plug 58b connects the second divided portion 121b of the third bottom electrode 121 and the first divided portion 131a of the third top electrode 131. Moreover, the plug 56c connects the second divided portion 124b of the second bottom electrode 124 and the first divided portion 134a of the second top electrode 134. The plug 58c connects the first divided portion 124a of the second bottom electrode 124 and the second divided portion 134b of the second top electrode 134.

The piezoelectric actuator according to the fourth modification of the embodiment of the present invention is different from the third modification in that the first to third bottom electrodes 122, 124, 121 and the first to third top electrodes 132, 134, 131 are respectively divided. Other configurations are similar to the third modification of the embodiment. Thus, duplicated descriptions are omitted.

In the fourth modification of the embodiment, by applying a common potential to the first divided portions 122a, 121a of the first and third bottom electrodes 122, 121, a negative drive voltage is applied to the first divided portions 132a, 131a of the first and third top electrodes 132, 131. Hence, the common potential is supplied to the second divided portions 132b, 131b of the first and third top electrodes 132, 131, the second divided portion 124b of the second bottom electrode 124, and the first divided portion 134a of the second top electrode 134. The negative drive voltage is supplied to the second divided portions 122b, 121b of the first and third bottom electrodes 122, 121, the second divided portion 134b of the second top electrode 134, and the first divided portion 124a of the second bottom electrode 124.

As a result, the first sections 140a, 141a of the first and third beams 40a, 41a connected to the fixed ends 44, 45 bend so as to increase the slopes of bending towards the substrate 10. The second sections 140b, 141b of the first and third beams 40a, 41a bend so as to become parallel to the surface of the substrate 10. Moreover, in the second beam 42a, the second section bends so as to increase a slope of bending towards the substrate 10. The first section 142a bends so as to become parallel to the surface of the substrate 10.

The first sections 140a, 142a, 141a and the second sections 140b, 142b, 141b have substantially the same lengths. Hence, at the connecting end 52, the slopes of bending of the first to third beams 40a, 42a, 41a become substantially parallel to the substrate 10. In a similar way, at the working end 48, the slope of bending of the second beam 42a becomes substantially parallel to the substrate 10. In the piezoelectric actuator according to the fourth modification of the embodiment, the surface of the movable electrode 24a can be displaced substantially in parallel to the surface of the fixed electrode 16 on the substrate 10. Thus, it is possible to achieve a desirable capacitance variation property for a variable capacitor.

(Fifth Modification)

Figure 35:
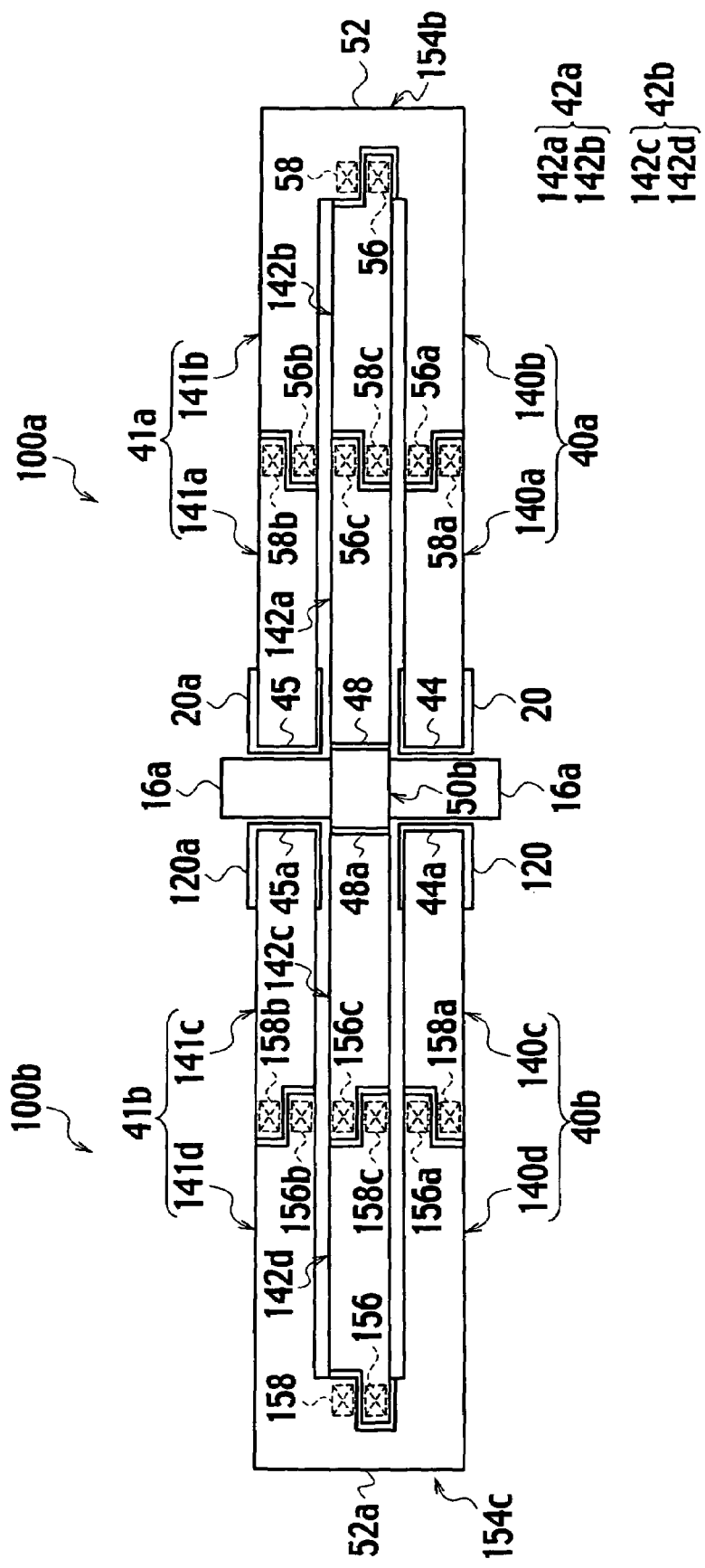
FIG. 35 is a schematic plan view showing an example of a piezoelectric actuator according to a fifth modification of the embodiment of the present invention.

A piezoelectric actuator according to a fifth modification of the embodiment of the present invention, as shown in FIG. 35, includes two piezoelectric actuators shown in FIG. 30, disposed symmetrically by sharing a working portion 50b. Anchors 120 and 120a which fix a second actuator 100b face the anchors 20 and 20a which fix a first actuator 100a so as to sandwich a fixed electrode 16a. Fixed ends 44a, 45a of first and third beams 40b, 41b on the anchors 120, 120a face the fixed ends 44, 45 of the first and third beams 40a, 41a on the anchors 20, 20a, respectively. A working end 48a of a second beam 42b of the second actuator 100b is connected to the working end 48 of the second beam 42a of the first actuator 100a through the working portion 50b. The first to third beams 40b, 42b, 41b have first sections 140c, 142c, 141c and second sections 140d, 142d, 141d, respectively. The first and third beams 40b, 41b are connected to each other through a connecting end 52a.

Plugs 156, 158 which connect bottom and top electrodes of a connecting portion 154c and upper and bottom electrodes of the second beam 42b are provided in the connecting portion 154c. Plugs 158a, 156a are provided in the first and second sections 140c, 140d of the first beam 40b. Plugs 158b, 156b are provided in the first and second sections 141c, 141d of the third beam 41b. Plugs 156c, 158c are provided in the first and second sections 142c, 142d of the second beam 42b.

The piezoelectric actuator according to the fifth modification of the embodiment of the present invention is different from the fourth modification in that the first and second actuators 100a, 100b are disposed in a mirror symmetry by sharing the working portion 50b. Other configurations are similar to the fourth modification of the embodiment. Thus, duplicated descriptions are omitted.

Figure 36:
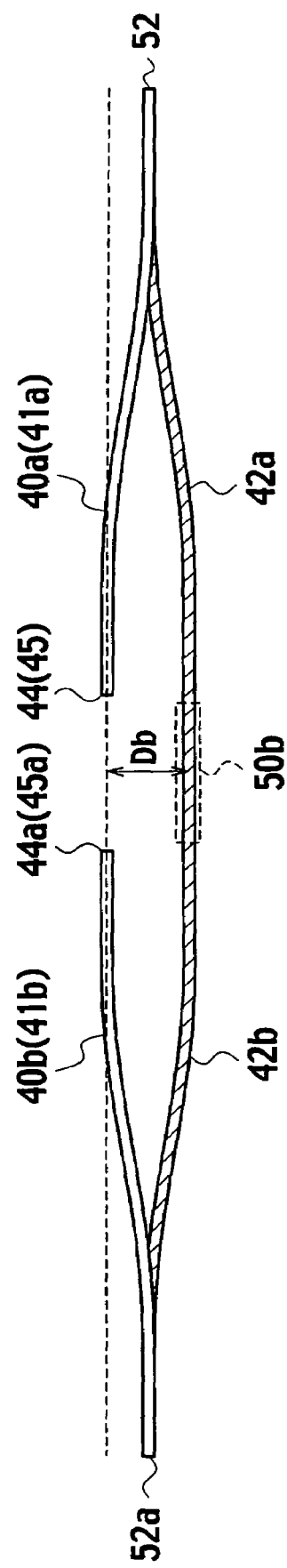
FIG. 36 is a schematic view showing an example of a piezoelectric drive of the piezoelectric actuator according to the fifth modification of the embodiment of the present invention.

As shown in FIG. 36, in the fifth modification of the embodiment, the piezoelectric actuator has a double-clamped suspended structure of a pantograph-type, in which the first and third beams 40a, 40b, 41a, 41b, and the second beams 42a and 42b are provided. The first and third beams 40a, 40b, 41a, 41b are fixed at the fixed ends 44, 44a, 45, 45a, respectively. The second beams 42a and 42b are respectively folded from the connecting ends 52, 52a and connected to the working portion 50b. By the pantograph-type piezoelectric actuator, the displacement Db of the working portion 50b can be controlled more stably with good reproducibility. Moreover, in the pantograph-type piezoelectric actuator, the drive force may be doubled. Thus, in particular in the case of using the pantograph-type piezoelectric actuator to a DC contact-type switch, it is possible to achieve a suitable pressing force for switching.

(Sixth Modification)

Figure 37:
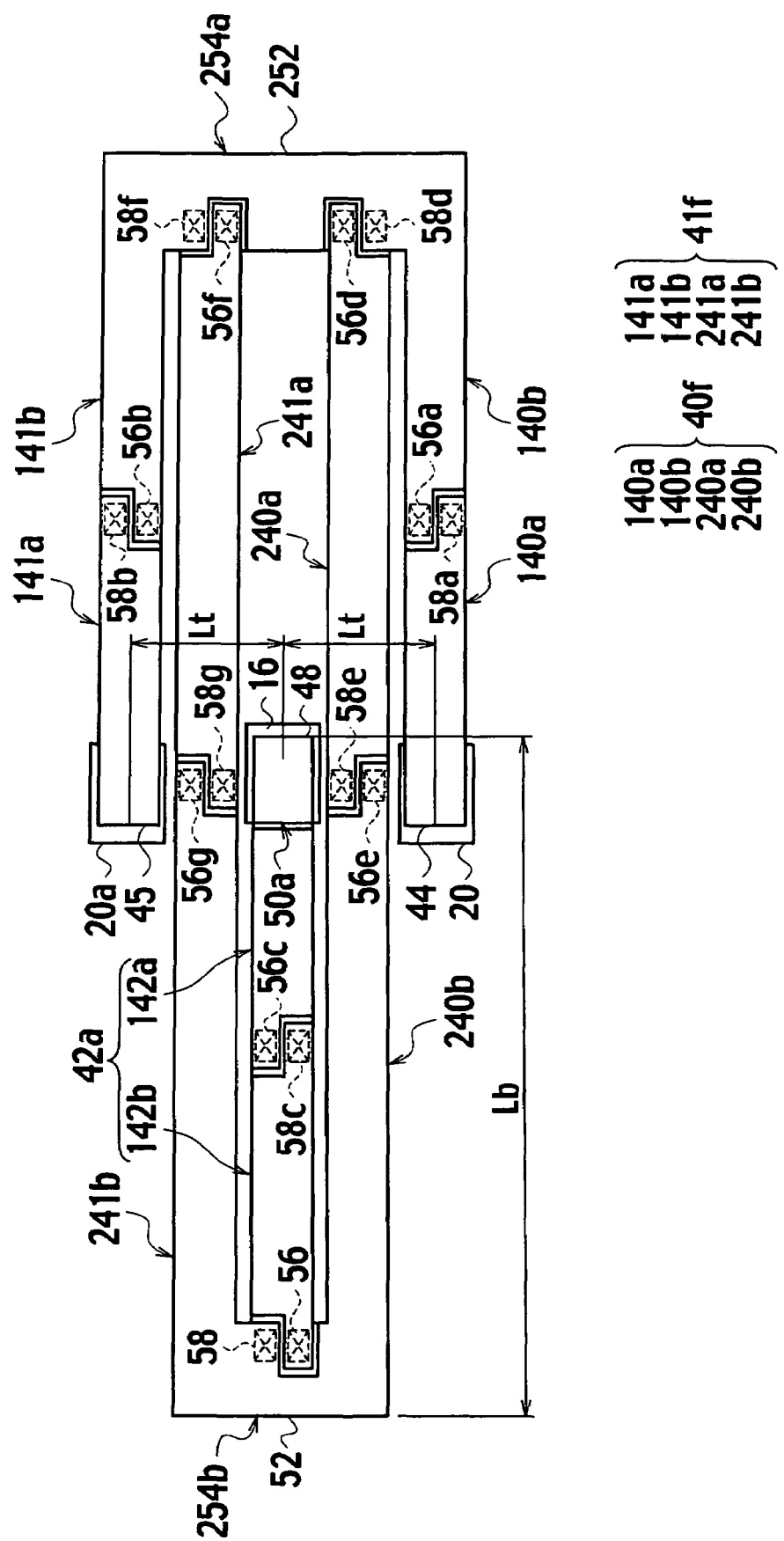
FIG. 37 is a schematic plan view showing an example of a piezoelectric actuator according to a sixth modification of the embodiment of the present invention.

A piezoelectric actuator according to a sixth modification of the embodiment of the present invention, as shown in FIG. 37, includes first and third beams 40f, 41f extended while being folded at a connecting end 252. Each of the first and third beams 40f, 41f has the first sections 140a, 141a, the second sections 140b, 141b, third sections 240a, 241a, and fourth sections 240b, 241b. The second sections 140b and 141b are connected to each other through a connecting portion 254a having the connecting end 252 opposite to the fixed ends 44, 45. The first and third beams 40f, 41f are folded from the connecting portion 254a, and extended beyond the fixed ends 44, 45 and the working end 48 to the connecting end 52 opposite to the connecting end 252. The fourth sections 240b, 241b are connected to each other through a connecting portion 254b. The second beam 42a is extended from the connecting end 52 to the working end 48. The beam interval Lt between the fixed end 44, 45 and the working end 48 is shorter than the beam length Lb between the connecting end 52 and the working end 48. For example, the beam interval Lt is desirably one third or less of the beam length Lb.

In the first beam 40f, plugs 56a, 58a are provided between the first and second sections 140a, 140b. The plugs 56a, 58a connect bottom and top electrodes of the first section 140a to upper and bottom electrodes of the second section 140b, respectively. Plugs 56d, 58d are provided at the connecting portion 254a. The plugs 56d, 58d connect bottom and top electrodes of the second section 140b to upper and bottom electrodes of the third section 240a, respectively. Plugs 56e, 58e are provided between the third and fourth sections 240a, 240b. The plugs 56e, 58e connect bottom and top electrodes of the third section 240a to upper and bottom electrodes of the fourth section 240b, respectively.

In the third beam 41f, plugs 56b, 58b are provided between the first and second sections 141a, 141b. The plugs 56b, 58b connect bottom and top electrodes of the first section 141a to upper and bottom electrodes of the second section 141b, respectively. Plugs 56f and 58f are provided at the connecting portion 254a. The plugs 56f, 58f connect bottom and top electrodes of the second section 141b to upper and bottom electrodes of the third section 241a, respectively. Plugs 56g, 58g are provided between the third and fourth sections 241a, 241b. The plugs 56g, 58g connect bottom and top electrodes of the third section 241a to upper and bottom electrodes of the fourth section 241b, respectively.

Moreover, in the second beam 42a, the plugs 56 and 58 are provided at the connecting portion 254b. The plugs 56 and 58 connect bottom and top electrodes of the connecting portion 254b to upper and bottom electrodes of the second section 142b, respectively. Plugs 56c, 58c are provided between the first and second sections 142a, 142b. The plugs 56c, 58c connect bottom and top electrodes of the second section 142b to upper and bottom electrodes of the first section 142a, respectively.

The piezoelectric actuator according to the sixth modification of the embodiment of the present invention is different from the fourth modification in that the first and third beams 40f and 41f are folded at the connecting end 252, and individually connected to the second beam 42a at the connecting end 52. Other configurations are similar to the fourth modification. Thus, duplicated descriptions are omitted.

Figure 38:
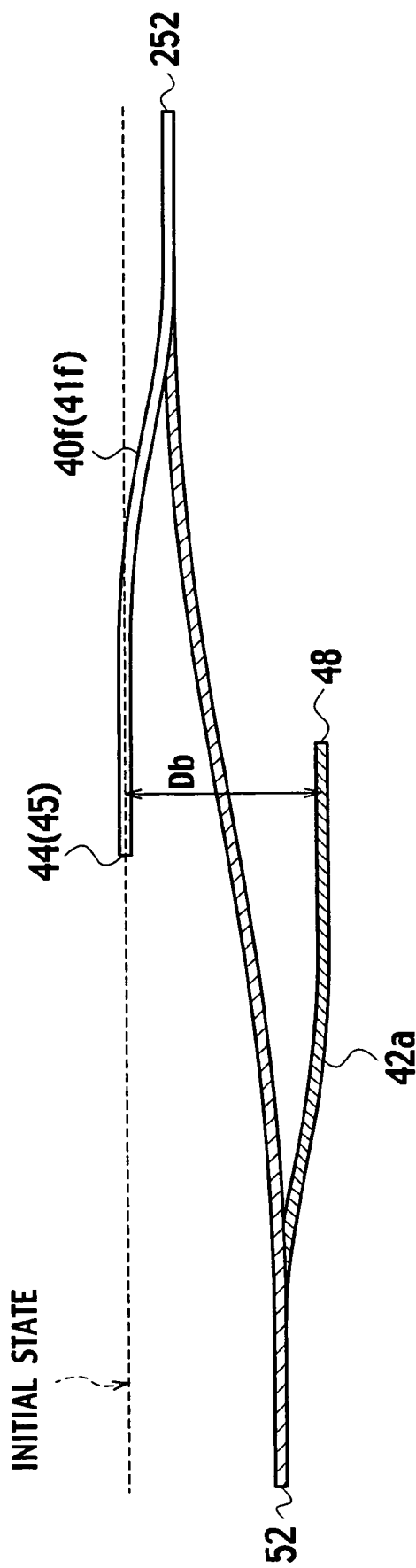
FIG. 38 is a schematic view showing an example of a piezoelectric drive of the piezoelectric actuator according to the sixth modification of the embodiment of the present invention.

As shown in FIG. 38, in the sixth modification, the displacement Db between the fixed end 44, 45 and the working end 48 can be increased by four times the displacement of the first and third beam 40f, 41f. Hence, it is possible to increase a variable capacitance range of a variable capacitor.

(Seventh Modification)

Figure 39:
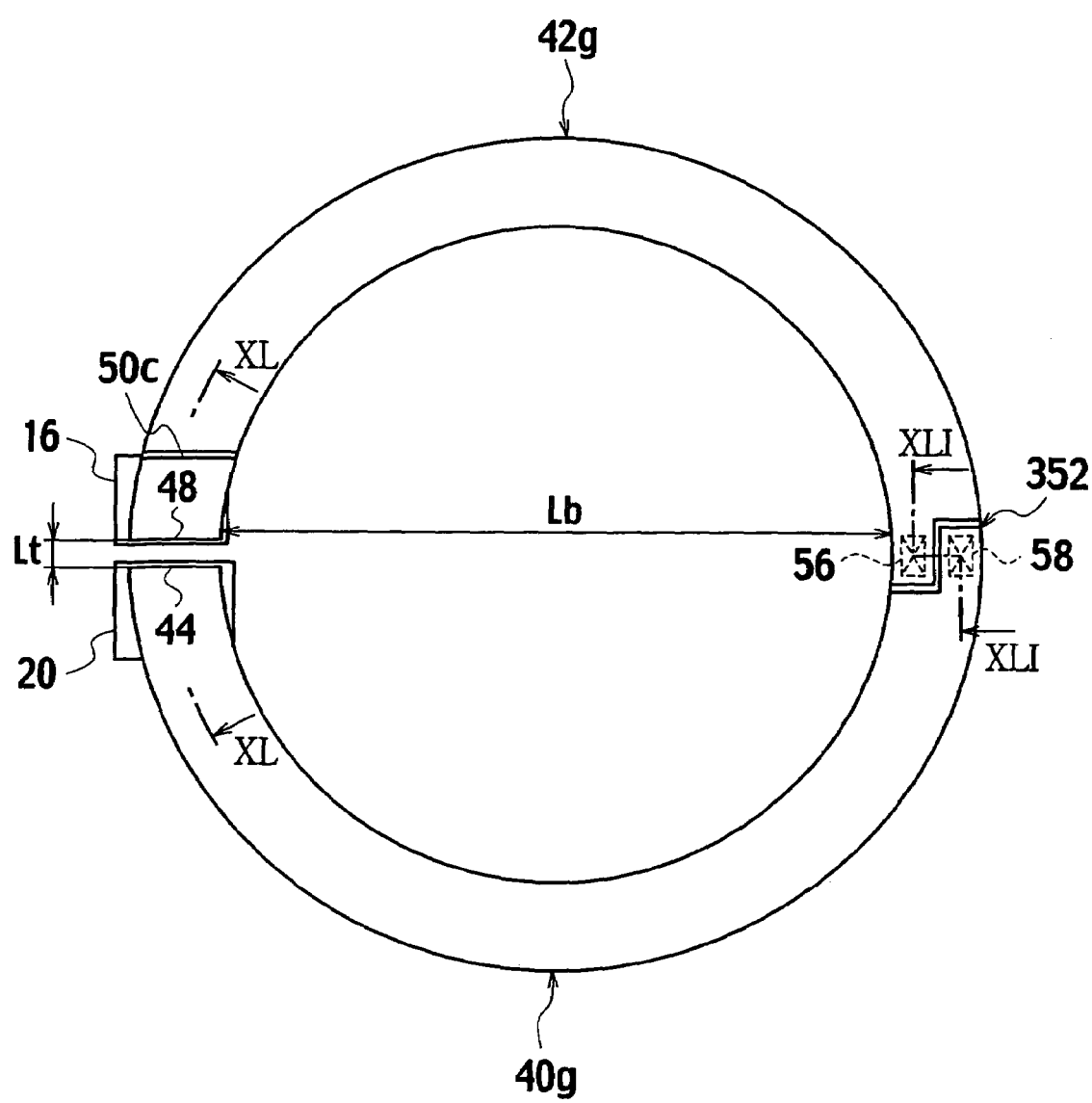
FIG. 39 is a schematic plan view showing an example of a piezoelectric actuator according to a seventh modification of the embodiment of the present invention.

A piezoelectric actuator according to a seventh modification of the embodiment of the present invention, as shown in FIG. 39, includes a first beam 40g and a second beam 42g which are arranged in a c-ring shape. The fixed end 44 of the first beam 40g and the working end 48 of the second beam 42g are placed adjacent to each other with a beam interval Lt. Note that a direct distance between a connecting end 352 at a partitioned position of the first and second beams 40g, 42g in the c-ring shape and a working portion 50c including the working end 48 is defined as a beam length Lb.

Figure 40:
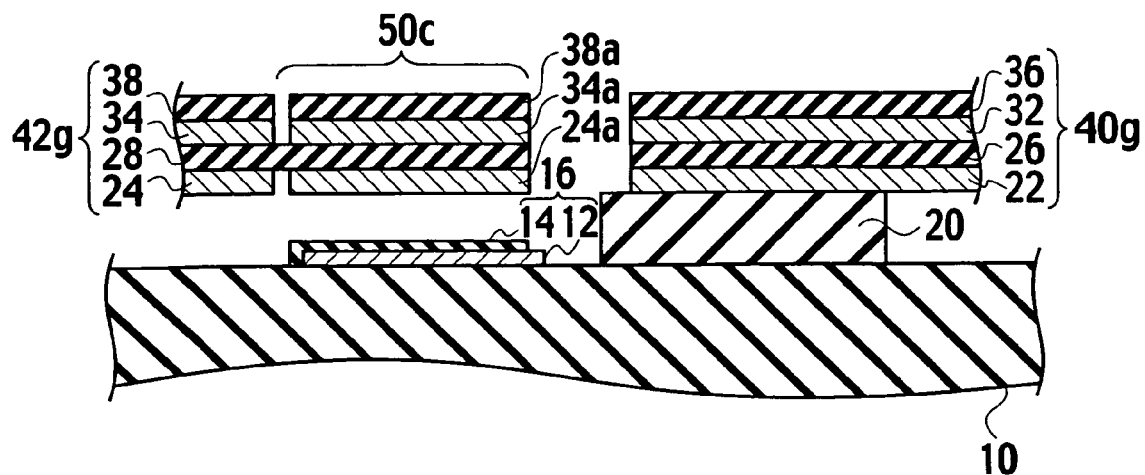
FIG. 40 is a schematic view showing an example of a cross section along a line XL—XL of the piezoelectric actuator of FIG. 39.
Figure 41:
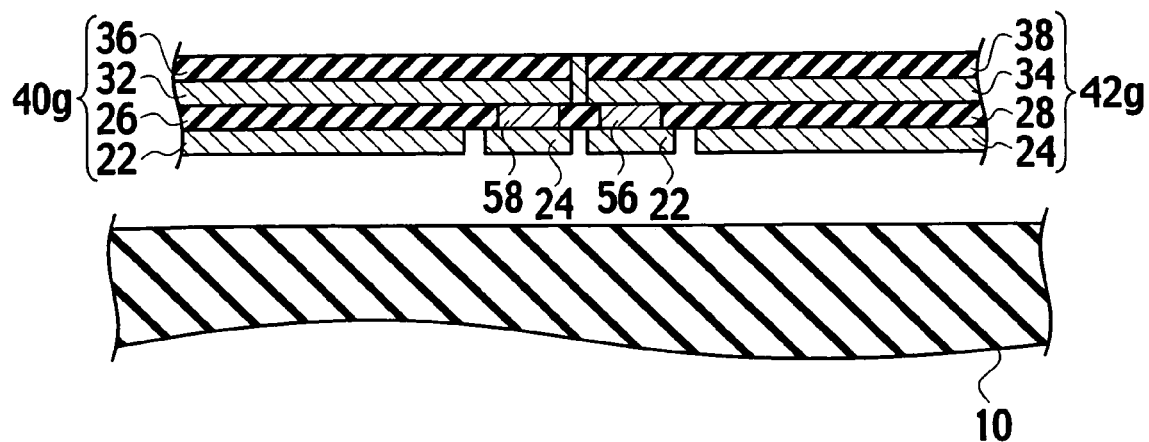
FIG. 41 is a schematic view showing an example of a cross section along a line XLI—XLI of the piezoelectric actuator of FIG. 39.

As shown in FIG. 40, the fixed end 44 of the first beam 40a is fixed on the anchor 20. The working portion 50c of the second beam 42g includes the movable supporting film 38a, and the movable electrodes 24a and 34a facing each other to sandwich the second piezoelectric film 28. As shown in FIG. 41, the plugs 56 and 58 are formed using a metal and the like, buried in the via holes provided in the piezoelectric films 26 and 28 in the vicinity of the connecting end 352 at the partitioned position of the first and second beams 40g and 42g. The plug 56 connects the second top electrode 34 of the second beam 42g and the first bottom electrode 22 of the first beam 40g. Moreover, the plug 58 connects the second bottom electrode 24 of the second beam 42g and the first top electrode 32 of the first beam 40g. Hence, the second bottom electrode 24 is connected to the first and third top electrodes 32, 31, and the second top electrode 34 is connected to the first and third bottom electrodes 22, 21.

The piezoelectric actuator according to the seventh modification of the embodiment of the present invention is different from the third modification in that the first and second beams 40g, 42g are connected in the c-ring shape. Other configurations are similar to the third modification of the embodiment. Thus, duplicated descriptions are omitted.

Also with regard to the piezoelectric actuator according to the seventh modification, the entire actuator in the c-ring shape has a substantially even cross-sectional structure. Hence, even if a vertically asymmetric residual stress occurs during deposition, the warpages in the first and second beams 40g, 42g is cancelled. As a result, the displacement due to the warpages between the fixed end 44 and the working end 48 can be decreased.

Figure 42:
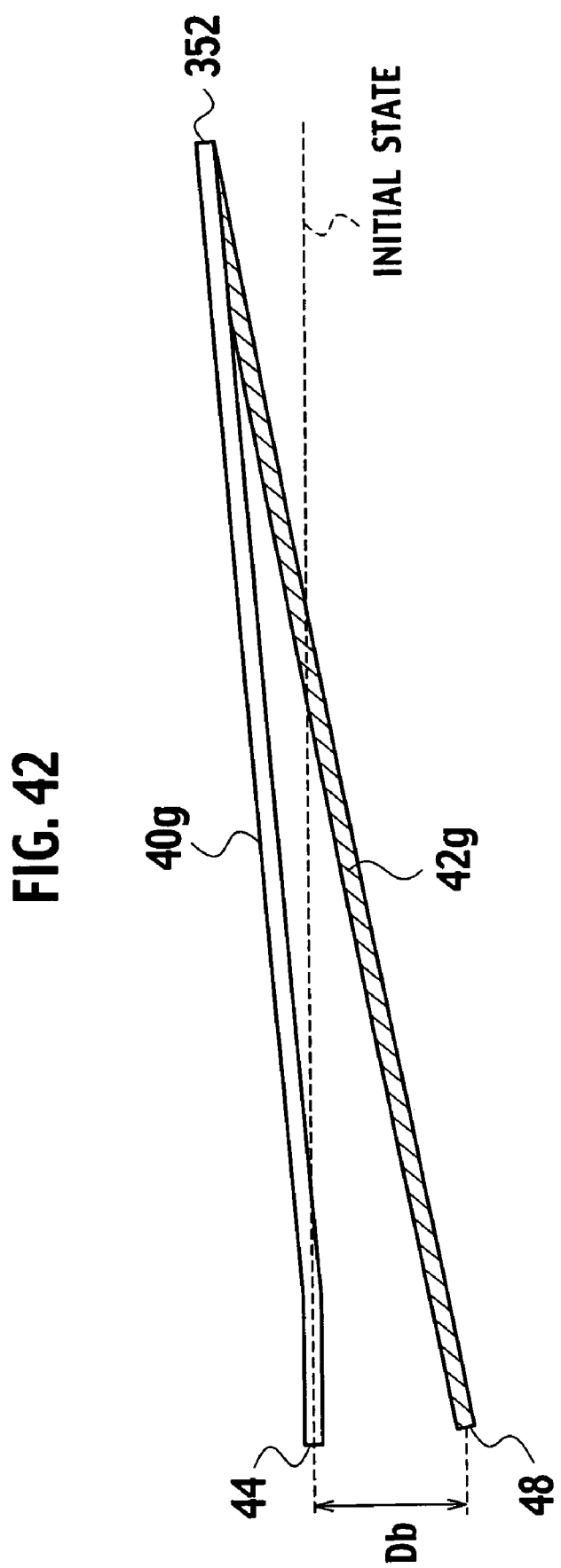
FIG. 42 is a schematic view showing an example of a piezoelectric drive of a piezoelectric actuator according to the seventh modification of the embodiment of the present invention.

When the positive drive voltage is applied to the first top electrode 32 in reference to the first bottom electrode 22, as shown in FIG. 42, the first beam 40g supported by the fixed end 44 bends upward. On the contrary, the second beam 42g bends downward from the connecting end 352. As a result, the working end 48 is displaced downward with respect to the fixed end 44 by the displacement Db. Hence, it is possible to control the displacement of the working end 48 with good reproducibility and high precision by a drive voltage applied to the first beam 40g.

In a high-frequency range, the piezoelectric actuator according to the seventh modification of the embodiment can be used as an inductor. A high-frequency signal, which is superimposed on a DC voltage for the piezoelectric drive, is applied to the ring-shaped electrodes. Thus, it is possible to provide a micro-electromechanical device, such as a variable capacitor or a switch, in which an inductor is combined.

(Eighth Modification)

Figure 43:
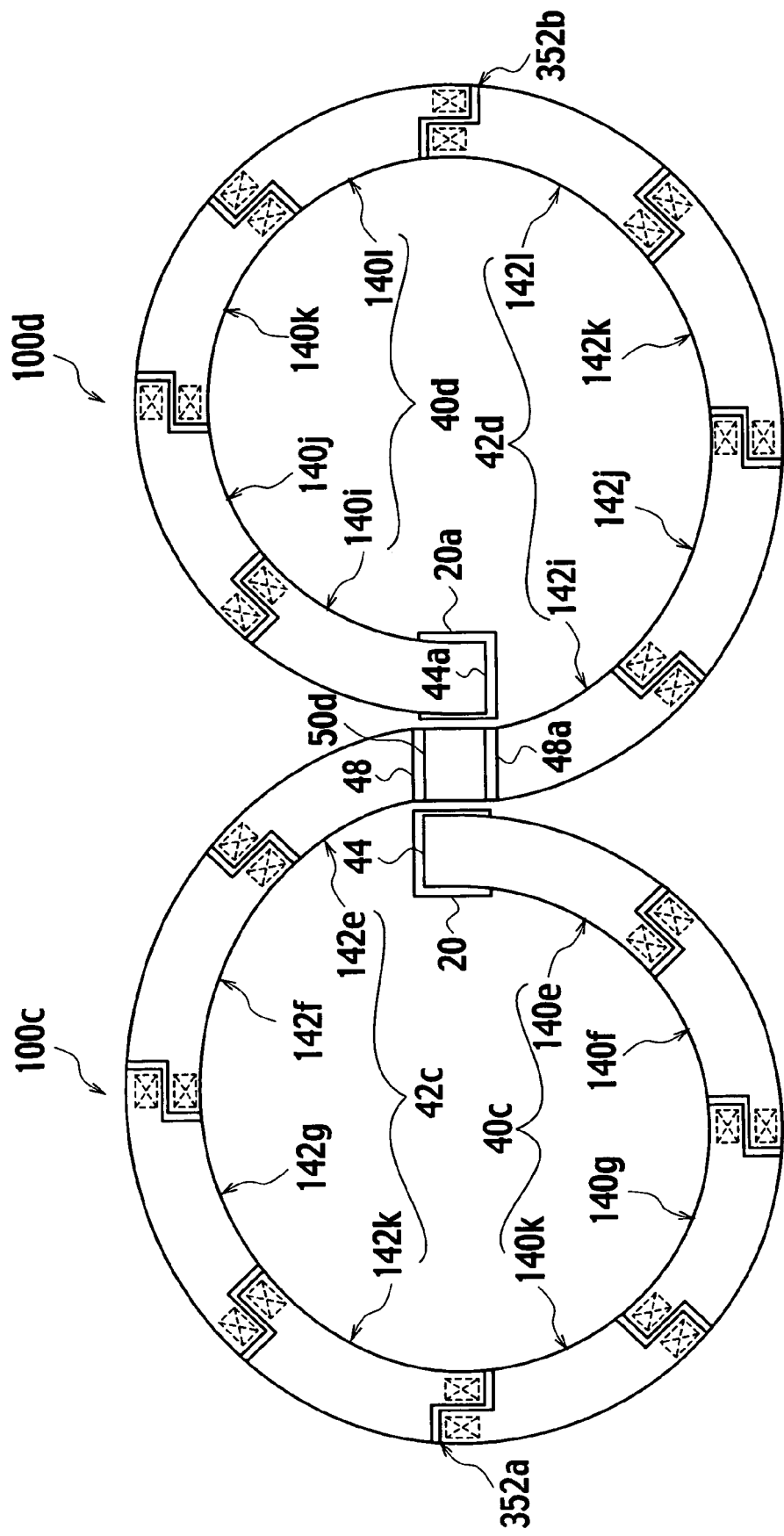
FIG. 43 is a schematic plan view showing an example of a piezoelectric actuator according to an eighth modification of the embodiment of the present invention.

A piezoelectric actuator according to an eighth modification of the embodiment of the present invention, as shown in FIG. 43, includes two c-ring shaped piezoelectric actuators are arranged in a point symmetry with respect to a sharing working portion 50d. The anchor 20 fixing a first actuator 100c faces the anchor 20a fixing a second actuator 100d to sandwich a fixed electrode (not shown) disposed below the working portion 50d. Each of the first and second beam 40c, 42c of the first actuator 100c has first sections 140e, 142e, second sections 140f, 142f, third sections 140g, 142g and fourth sections 140h, 142h. The first and second beam 40c, 42c are arranged in a c-ring shape from the fixed end 44 and the working end 48 to a connecting end 352a. Each of the first and second beam 40d, 42d of the second actuator 100d has first sections 140i, 142i, second sections 140j, 142j, third sections 140k, 142k and fourth sections 140l, 142l. The first and second beam 40d, 42d are arranged in a c-ring shape from the fixed end 44a and the working end 48a to a connecting end 352a. The working end 48 of the second beam 42c of the first actuator 100c is connected to the working end 48a of the second beam 42d of the second actuator 100d through the working portion 50d.

The piezoelectric actuator according to the eighth modification of the embodiment of the present invention is different from the fifth and seventh modifications in that the first and second actuators 100c, 100d having the plural sections are arranged in a point symmetry with respect to the sharing working portion 50d. Other configurations are similar to the fifth and seventh modifications. Thus, duplicated descriptions are omitted.

In the eighth modification of the embodiment, as the fifth modification shown in FIG. 36, the piezoelectric actuator has a double-clamped suspended structure of an eyeglasses-type, in which the first beams 40c, 40d and the second beams 42c, 42d are provided. The first beams 40c, 40d are fixed at the fixed ends 44 and 44a, respectively. The second beams 42c, 42d are folded in a c-ring shape and connected to the working portion 50d. By the eyeglasses-type piezoelectric actuator, the displacement of the working portion 50d can be controlled stably with good reproducibility. Moreover, in the eyeglasses-type piezoelectric actuator, the drive force maybe doubled. Thus, in particular in the case of using the eyeglasses-type piezoelectric actuator to a DC contact-type switch, it is possible to achieve a suitable pressing force for switching.

(Ninth Modification)

Figure 44:
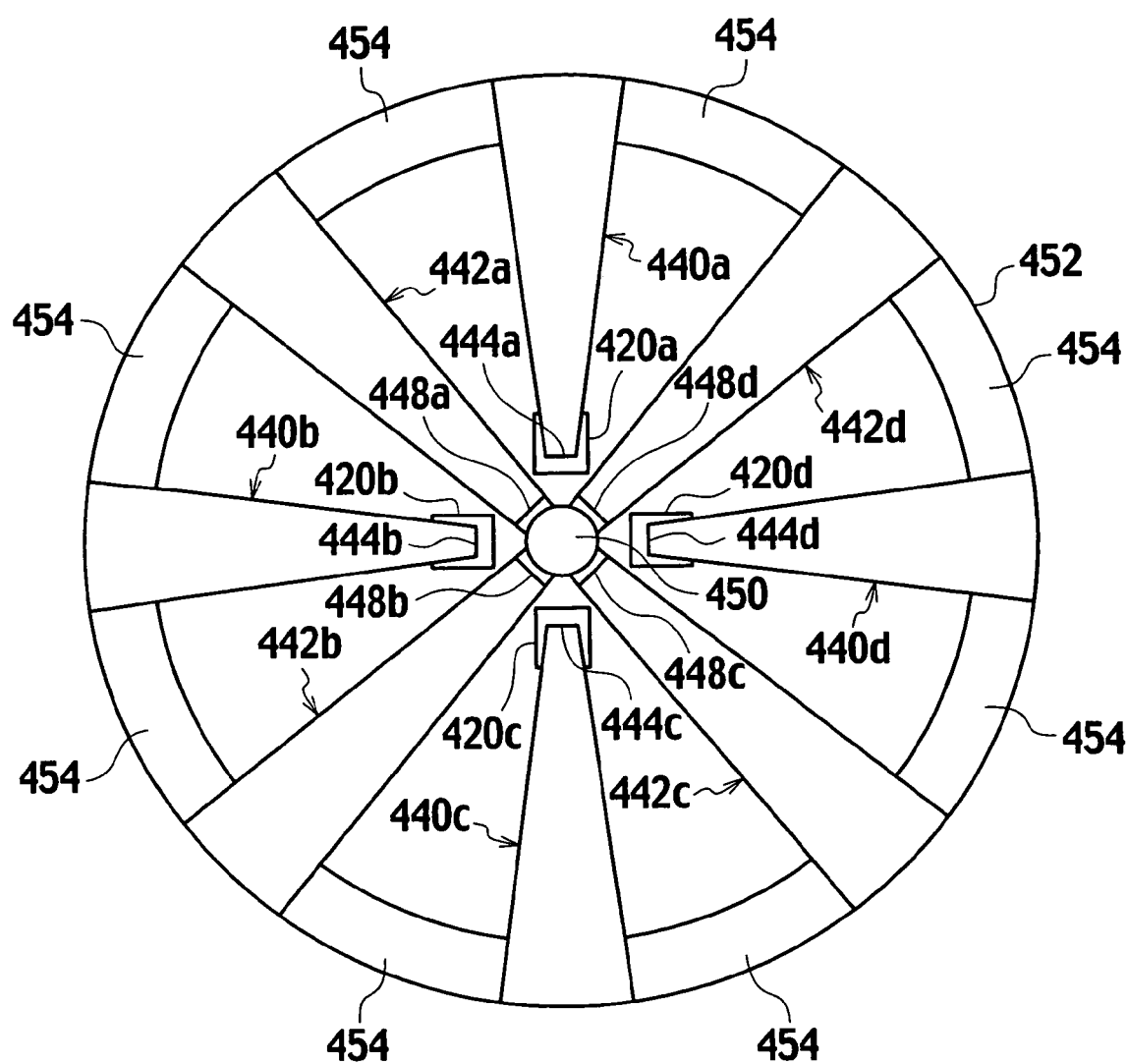
FIG. 44 is a schematic plan view showing an example of a piezoelectric actuator according to a ninth modification of the embodiment of the present invention.

In a piezoelectric actuator according to a ninth modification of the embodiment of the present invention, as shown in FIG. 44, a plurality of actuators radiated from a working portion 450 located at a center of a ring-shaped connecting portion 454 are connected to the connecting portion 454 having a connecting end 452. For example, a first actuator includes a first beam 440a and a second beam 442a. The first beam 440a having a fixed end 444a fixed on an anchor 420a is extended to the connecting portion 454. The second beam 442a is folded from the connecting portion 454 to a working end 448a connected to the working portion 450. In a similar way, second to fourth actuators include first beams 440b, 440c, 440d and second beams 442b, 442c, 442d. The first beams 440b to 440d having fixed ends 444b to 444d fixed by anchors 420b to 420d are extended to the connecting portion 454, respectively. The second beams 442b to 442d is folded from the connecting portion 454 to working ends 448b to 448d connected to the working portion 450, respectively.

The piezoelectric actuator according to the ninth modification of the embodiment of the present invention is different from the embodiment in that the plurality of actuators are connected in the ring-shape to the connecting portion 454 with sharing the working portion 450. Other configurations are similar to the embodiment. Thus, duplicated descriptions are omitted.

In the ninth modification of the embodiment, the first to fourth actuators are connected to one another so as to go around the ring-shaped connecting portion 454 with respect to the working portion 450 as a center. The first and second beams 440a to 440d, 442a to 442d are respectively bent by the piezoelectric drive so that the connecting end 452 can be displaced in the direction perpendicular to the surface of the substrate. The fixed ends 444a to 444d are placed adjacent to the working ends 448a to 448d. Moreover, the fixed ends 444a to 444d are placed so as to surround the working portion 450. Furthermore, since the plurality of actuators are used, the drive force can be increased. As a result, it is possible to control the displacement of the working portion 450 more stably with good reproducibility.

(Other Embodiments)

In the embodiment of the present invention, the piezoelectric actuator folded once or twice is used. However, a number of folds is not limited, but a plurality of folds more than twice may be permissible. Moreover, a number of sections of each beam of the piezoelectric actuator is not limited, but a plurality of sections more than two may be permissible.

Figure 45:
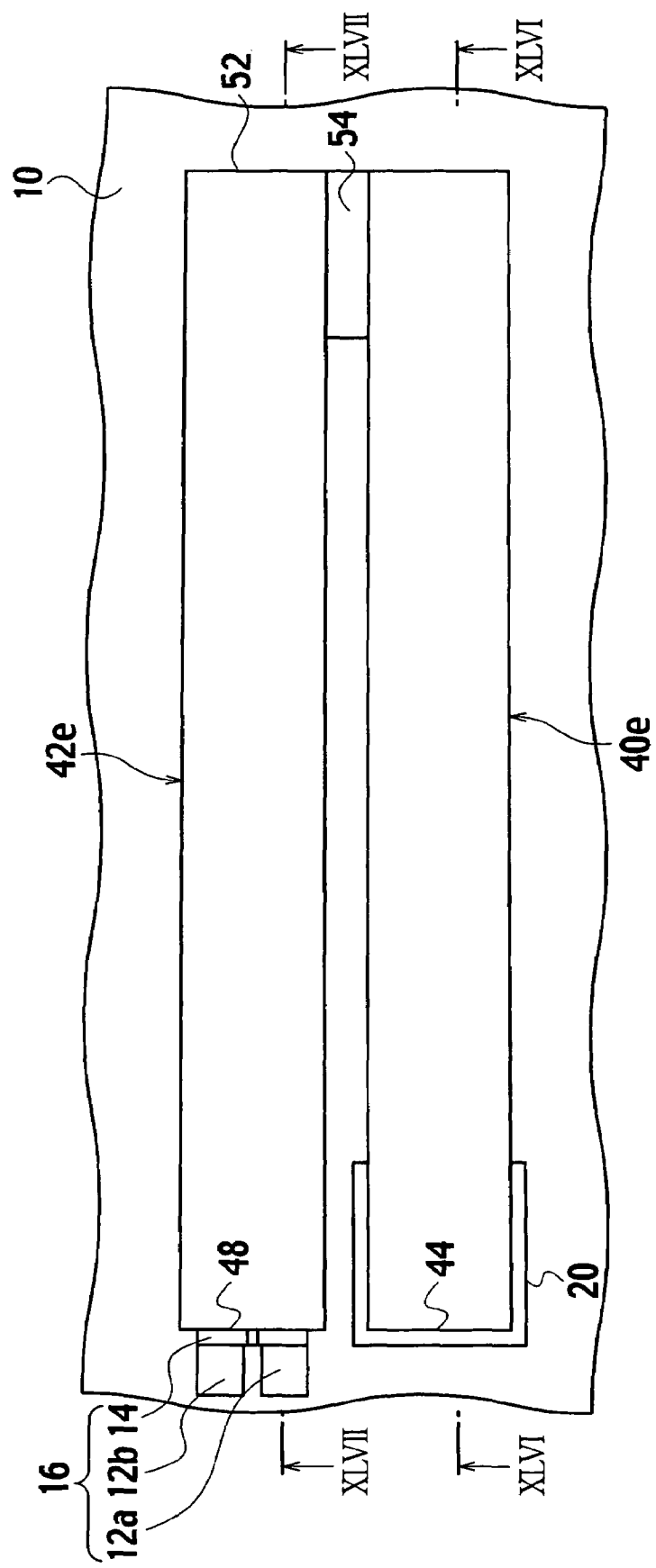
FIG. 45 is a schematic plan view showing an example of a piezoelectric actuator according to other embodiments of the present invention.

Moreover, in the embodiment of the present invention, the piezoelectric actuator having a unimorph structure is used. However, a bimorph structure may be used for the piezoelectric actuator. For example, as shown in FIG. 45, a piezoelectric actuator having a bimorph structure includes a first beam 40e and a second beam 42e. The first beam 40e is extended from the fixed end 44 fixed on the anchor 20 on the substrate 10 to the connecting end 52 of the connecting portion 54. The second beam 42e is extended from the connecting end 52 to the working end 48 in the direction to the fixed end 44 in parallel to the first beam 40e. Moreover, the fixed electrode 16 including the conductors 12a and 12b covered with the dielectric film 14 is provided on the surface of the substrate 10, so as to face the working end 48.

As shown in FIG. 46, in the first beam 40e, a first intermediate electrode 82 is provided between first piezoelectric films 26a, 26b sandwiched between the first bottom electrode 22 and the first top electrode 32. As shown in FIG. 47, in the second beam 42e, a second intermediate electrode 84 is provided between second piezoelectric films 28a and 28b sandwiched between the second bottom electrode 24 and the second top electrode 34. The first and second piezoelectric films 26a, 26b, 28a, 28b are deposited so as to polarize in the same direction.

For example, by applying a common potential to the first intermediate electrode 82 of the first beam 40e, a positive drive voltage is applied to the first bottom electrode 22 and the first top electrode 32. A contraction stress is generated in the first piezoelectric film 26a, and a tensile stress is generated in the first piezoelectric film 26b. As a result, the first beam 40e bends upward from the substrate 10.

The second bottom electrode 24 and the second top electrode 34 of the second beam 42e is electrically isolated from the first bottom electrode 22 and the first top electrode 32 of the first beam 40e, respectively. Therefore, the drive voltage is not applied the second bottom electrode 24 and the second top electrode 34. The second beam 42e is kept in an initial state. Hence, whether with or without residual stresses in the first and second piezoelectric films 26a, 26b, 28a, 28b, it is possible to displace the working end 48 of the second beam 42e toward the fixed electrode 16.

Various modifications will become possible for those skilled in the art after storing the teachings of the present disclosure without departing from the scope thereof.

What is claimed is:

1. A piezoelectric actuator, comprising:
a first beam including a first bottom electrode, a first piezoelectric film on the first bottom electrode, and a first top electrode on the first piezoelectric film, a fixed end assigned at an end of the first beam and a connecting end assigned at another end of the first beam, the fixed end fixed on a substrate, the connecting end suspended over a free space; and
a second beam including a second piezoelectric film connected to the first piezoelectric film at the connecting end, a second bottom electrode under the second piezoelectric film, and a second top electrode on the second piezoelectric film, a working end assigned at an end of the second beam opposite to another end to which the connecting end is assigned, the working end suspended over the free space;
wherein a distance between centers of the fixed end and the working end is shorter than a distance from the working end to the connecting end.

2. The piezoelectric actuator of claim 1, wherein the first top electrode is electrically isolated from the second top electrode, or the first bottom electrode is electrically isolated from the second bottom electrode.

3. The piezoelectric actuator of claim 1, wherein the first top electrode is electrically connected to the second bottom electrode, and the first bottom electrode is electrically connected to the second top electrode.

4. The piezoelectric actuator of claim 1, further comprising a third beam including a third piezoelectric film connected to the second piezoelectric film at the connecting end, a third bottom electrode under the third piezoelectric film, and a third top electrode on the third piezoelectric film, a second fixed end assigned at an end of the third beam opposite to another end to which the connecting end is assigned, the second fixed end fixed on the substrate.

5. The piezoelectric actuator of claim 1, wherein the first and second beams are provided in a ring shape from the fixed end to the working end.

6. The piezoelectric actuator of claim 4, wherein the third top electrode is electrically isolated from the second top electrode, or the third bottom electrode is electrically isolated from the second bottom electrode.

7. The piezoelectric actuator of claim 4, wherein the third top electrode is electrically connected to the second bottom electrode, and the third bottom electrode is electrically connected to the second top electrode.

8. The piezoelectric actuator of claim 4, wherein each of the first, second and third beams is partitioned into a plurality of sections, and each of the first, second and third bottom electrodes, and the first, second and third top electrodes is divided into a plurality of divided portions corresponding to the sections.

9. The piezoelectric actuator of claim 4, wherein a pair of the first, second and third beams are disposed on both sides of the working end in a mirror symmetry with respect to the working end.

10. The piezoelectric actuator of claim 4, wherein the first and third beams are folded at a second connecting end between the fixed end and the connecting end, extending to the connecting end.

11. A micro-electromechanical device, comprising:
a first beam including a first bottom electrode, a first piezoelectric film on the first bottom electrode, and a first top electrode on the first piezoelectric film, a fixed end assigned at an end of the first beam and a connecting end assigned at another end of the first beam, the fixed end fixed on a substrate, the connecting end suspended over a free space;
a second beam including a second piezoelectric film connected to the first piezoelectric film at the connecting end, a second bottom electrode under the second piezoelectric film, and a second top electrode on the second piezoelectric film, a working end assigned at an end of the second beam opposite to another end to which the connecting end is assigned, the working end suspended over the free space; and
a fixed electrode disposed on a surface of the substrate facing the working end,
wherein a distance between centers of the fixed end and the working end is shorter than a distance from the working end to the connecting end.

12. The micro-electromechanical device of claim 11, wherein the first top electrode is electrically isolated from the second top electrode, or the first bottom electrode is electrically isolated from the second bottom electrode.

13. The micro-electromechanical device of claim 11, wherein the first top electrode is electrically connected to the second bottom electrode, and the first bottom electrode is electrically connected to the second top electrode.

14. The micro-electromechanical device of claim 11, further comprising a third beam including a third piezoelectric film connected to the second piezoelectric film at the connecting end, a third bottom electrode under the third piezoelectric film, and a third top electrode on the third piezoelectric film, a second fixed end assigned at an end of the third beam opposite to another end to which the connecting end is assigned, the second fixed end fixed on the substrate.

15. The micro-electromechanical device of claim 11, wherein the first and second beams are provided in a ring shape from the fixed end to the working end.

16. The micro-electromechanical device of claim 14, wherein the third top electrode is electrically isolated from the second top electrode, or the third bottom electrode is electrically isolated from the second bottom electrode.

17. The micro-electromechanical device of claim 14, wherein the third top electrode is electrically connected to the second bottom electrode, and the third bottom electrode is electrically connected to the second top electrode.

18. The micro-electromechanical device of claim 14, wherein each of the first, second and third beams is partitioned into a plurality of sections, and each of the first, second and third bottom electrodes, and the first, second and third top electrodes is divided into a plurality of divided portions corresponding to the sections.

19. The micro-electromechanical device of claim 14, wherein a pair of the first, second and third beams are disposed on both sides of the working end in a mirror symmetry with respect to the working end.

20. The micro-electromechanical device of claim 14, wherein the first and third beams are folded at a second connecting end between the fixed end and the connecting end, extending to the connecting end.

* * * * *